(12) United States Patent
Park et al.

(10) Patent No.: US 10,333,193 B2
(45) Date of Patent: *Jun. 25, 2019

(54) PRINTED CIRCUIT BOARD AND PRINTED CIRCUIT BOARD FOR CAMERA MODULE

(71) Applicant: SAMSUNG ELECTRO-MECHANICS CO., LTD., Suwon-Si, Gyeonggi-Do (KR)

(72) Inventors: Dae Hyun Park, Suwon-Si (KR); Han Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 604 days.

This patent is subject to a terminal disclaimer.

(21) Appl. No.: 14/754,307

(22) Filed: Jun. 29, 2015

(65) Prior Publication Data

US 2016/0006102 A1 Jan. 7, 2016

(30) Foreign Application Priority Data

Jul. 2, 2014 (KR) ........................ 10-2014-0082510

(51) Int. Cl.
| | | |
|---|---|---|
| H05K 7/00 | (2006.01) | |
| H01P 3/02 | (2006.01) | |
| H01P 3/08 | (2006.01) | |
| H05K 1/02 | (2006.01) | |
| H04N 5/225 | (2006.01) | |

(52) U.S. Cl.
CPC .............. *H01P 3/026* (2013.01); *H01P 3/085* (2013.01); *H04N 5/2257* (2013.01); *H05K 1/0253* (2013.01); *H05K 1/0245* (2013.01); *H05K 2201/09263* (2013.01); *H05K 2201/10204* (2013.01)

(58) Field of Classification Search
CPC ....... H01P 3/026; H01P 3/085; H04N 5/2257; H05K 1/0245; H05K 1/0253; H05K 2201/09263; H05K 2201/10204
See application file for complete search history.

(56) References Cited

U.S. PATENT DOCUMENTS 6,853,350 B2 * 2/2005 Alexopoulos ......... H01P 1/2005
343/700 MS
9,496,594 B2 * 11/2016 Park ..................... H05K 1/0253
(Continued)

FOREIGN PATENT DOCUMENTS

| CN | 1753597 A | 3/2006 |
|---|---|---|
| JP | 2006086293 | * 3/2006 |

(Continued)

OTHER PUBLICATIONS

Korean Office Action dated Sep. 14, 2017, in corresponding Korean Application No. 10-2014-0082510 (5 pages in English, 4 pages in Korean).

(Continued)

*Primary Examiner* — Yuriy Semenenko
(74) *Attorney, Agent, or Firm* — NSIP Law

(57) ABSTRACT

A printed circuit board and a printed circuit board includes a signal transmitting part; a ground part that includes an impedance adjusting part and a dummy part; and an insulating layer disposed between the signal transmitting part and the ground part.

38 Claims, 16 Drawing Sheets

(56) References Cited

U.S. PATENT DOCUMENTS

| | | | |
|---|---|---|---|
| 2006/0044211 A1* | 3/2006 | Ramprasad | H01Q 1/22 343/909 |
| 2006/0061432 A1 | 3/2006 | Hsu et al. | |
| 2007/0004097 A1* | 1/2007 | Yu | H01L 23/49811 438/129 |
| 2008/0266028 A1* | 10/2008 | Wyland | H01L 23/64 333/204 |
| 2009/0225431 A1* | 9/2009 | Lee | G02B 7/02 359/621 |
| 2012/0009983 A1* | 1/2012 | Mow | H01Q 1/243 455/575.7 |
| 2013/0153266 A1 | 6/2013 | Hyun et al. | |
| 2014/0376199 A1* | 12/2014 | Kato | H01P 3/085 361/753 |

FOREIGN PATENT DOCUMENTS

| | | | |
|---|---|---|---|
| JP | 2012-227211 A | | 11/2012 |
| JP | WO2013190859 | * | 12/2013 |
| KR | 2012-0050175 A | | 5/2012 |
| KR | 10-2013-0070534 A | | 6/2013 |
| KR | 10-2014-0000983 A | | 1/2014 |

OTHER PUBLICATIONS

Chinese Office Action dated Apr. 3, 2018 in corresponding Chinese Patent Application No. 201510425360.0 (14 pages in English, 12 pages in Chinese).

* cited by examiner

PRINTED CIRCUIT BOARD AND PRINTED CIRCUIT BOARD FOR CAMERA MODULE

CROSS REFERENCE(S) TO RELATED APPLICATIONS

This application claims the benefit under 35 U.S.C. Section 119 of Korean Patent Application Serial No. 10-2014-0082510, entitled "Printed Circuit Board and Printed Circuit Board for Camera Module" filed on Jul. 2, 2014, which is hereby incorporated by reference in its entirety into this application.

BACKGROUND

1. Technical Field

The present disclosure relates to a printed circuit board and a printed circuit board for a camera module.

2. Description of the Related Art

A kind of transmission lines and an electromagnetic field depending on the kind of transmission lines may be mainly classified into a micro-strip line and a strip line. In both the micro-strip line and the strip line, a signal line forms a ground and an electric field. Here, the formed electric field has an influence on a characteristic impedance.

Impedance characteristics in the micro-strip line and the strip line are determined by a line width and thickness of the signal line, a height between the signal line and a ground pattern, and a permittivity $\varepsilon_r$ of a medium configuring an insulating layer.

However, in the case in which impedance matching is not performed in the respective components and a circuit, an integrated circuit (IC) may be damaged or energy loss may be caused, due to a reflective wave.

SUMMARY

An object of the present disclosure is to provide a printed circuit board and a printed circuit board for a camera module capable of adjusting an impedance.

Another object of the present disclosure is to provide a printed circuit board and a printed circuit board for a camera module capable of adjusting an impedance and significantly improving warpage preventing characteristics.

The above-mentioned objects of the present disclosure may accomplished by a printed circuit board and a printed circuit board for a camera module that may improve warpage preventing characteristics by implementing a dummy pattern together with a ground pattern in a ground region and adjust an impedance using a shape of the ground pattern.

DESCRIPTION OF THE PREFERRED EMBODIMENTS

The acting effects and technical configuration with respect to the objects of a printed circuit board and a printed circuit board for a camera module according to the present disclosure will be clearly understood by the following detailed description in which exemplary embodiments of the present disclosure are described with reference to the accompanying drawings.

Further, when it is determined that a detailed description of the known art related to the present disclosure may obscure the gist of the present disclosure, the detailed description thereof will be omitted. In the description, the terms "first", "second", and the like, are used to distinguish one element from another element, and the elements are not defined by the above terms.

Printed Circuit Board

<First Exemplary Embodiment>

Figure 1A:
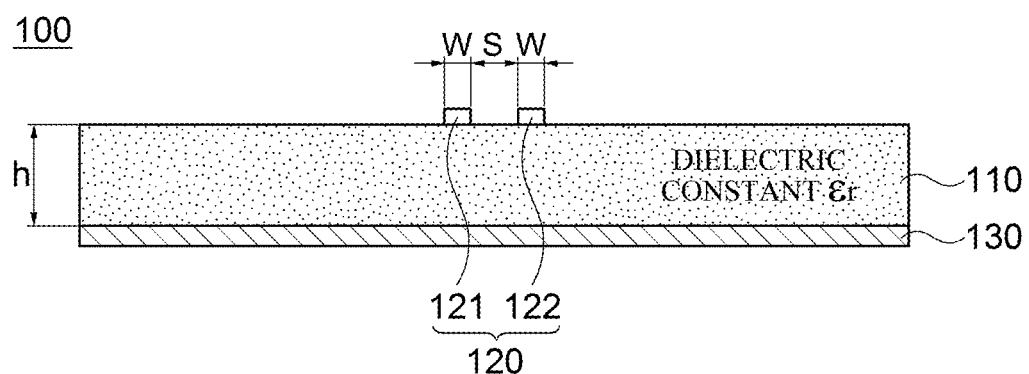
FIGS. 1A and 1B are cross-sectional views of a printed circuit board according to a first exemplary embodiment of the present disclosure.
Figure 1B:
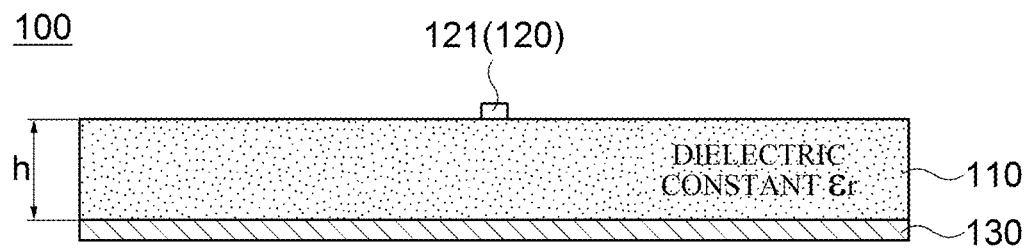

FIGS. 1A and 1B are cross-sectional views of a printed circuit board according to the present exemplary embodiment.

A printed circuit board 100 according to the present exemplary embodiment may include a signal transmitting part 120 and a ground part 130 disposed with an insulating layer 110 interposed therebetween. For example, as shown in FIG. 1A, the signal transmitting part 120 may be disposed on the insulating layer 110, and the ground part 130 may be disposed beneath the insulating layer 110. However, the present disclosure is not limited thereto, but may have any structure as long as the signal transmitting part 120 and the ground part 130 may be disposed with the insulating layer 110 interposed therebetween.

The insulating layer 110 according to the present exemplary embodiment may be made of a medium having a dielectric constant $\varepsilon_r$, and may have a predetermined height h depending on a size of a product in which the printed circuit board 100 is used.

Here, as the insulating layer 110, a resin insulating layer may be used. As a material of the resin insulating layer, a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, a prepreg may be used. In addition, a thermosetting resin, a photo-curable resin, or the like, may be used. However, the present disclosure is not particularly limited thereto.

In addition, the printed circuit board 100 according to the present exemplary embodiment in which the insulating layer 110 is used may be a single layer board formed of the insulating layer or a multilayer board in which a plurality of insulating layers and a plurality of circuit layers are alternately stacked.

Meanwhile, the signal transmitting part 120 according to the present exemplary embodiment may include at least one signal line, for example, a pair of signal lines 121 and 122 having a predetermined width W, disposed at a predetermined interval S, and extended in a length direction, as shown in FIG. 1A. The pair of signal lines 121 and 122 may be two lanes supporting a mobile industry processor interface (MIPI).

Here, the MIFI means a new standard of a serial interface for connecting a control signal between a processor and peripheral devices in a mobile device, and may be used for transmitting and receiving data between a mobile camera module and a main processor in the present exemplary embodiment.

Particularly, in the case in which impedance matching is not performed in signal lines used in the MIPI of the camera module, which are differential pair lines, signal transmission characteristics are deteriorated, such that a problem such as image noise, or the like, may occur.

However, the signal transmitting part 120 according to the present disclosure is not limited to having only a configuration of the signal lines (that is, the pair of signal lines) shown in FIG. 1A, but may have any configuration as long as it includes at least one signal line. Therefore, the signal transmitting part 120 according to the present exemplary embodiment may include one pair or more of signal lines or include only one signal line 121 as shown in FIG. 1B.

In addition, the signal lines 121 and 122, which transmits a control signal, or the like, may be formed of conductor patterns made of at least one or a mixture of at least two selected from the group consisting of silver (Ag), palladium (Pd), aluminum (Al), nickel (Ni), titanium (Ti), gold (Au), copper (Cu), and platinum (Pt) having excellent electrical conductivity.

Meanwhile, in the printed circuit board 100 according to the present exemplary embodiment, only the insulating layer 110 is present between the signal lines 121 and 122 and the ground part 130, thereby making it possible to prevent interference of a signal from an electromagnetic field generated due to concentration of alternating current (AC) energy at a high frequency.

In such a structure of the signal lines 121 and 122 as in the present exemplary embodiment, impedance characteristics are affected by a line width W of the signal lines 121 and 122, a height h between the signal lines 121 and 122 and the ground part 130, and a permittivity $\varepsilon_r$ of the medium forming the insulating layer 110. At the high frequency, most of the energy components of the signal between the signal lines 121 and 122 and the ground part 130 progress while being configured in an AC field form.

Therefore, the signal lines 121 and 122 are disposed on an upper surface of the insulating layer 110 while having a predetermined line width W depending on a condition (height h/permittivity $\varepsilon_r$) of the insulating layer 110, thereby configuring a circuit.

In addition, the signal lines 121 and 122 may be formed by a photo etching method, or the like, and it is advantageous to form the signal lines 121 and 122 so as to have a thin line width W in the case in which an impedance is low since an influence depending on the line width of the signal lines 121 and 122 may not be ignored when a frequency becomes high.

Meanwhile, the ground part 130 according to the present exemplary embodiment, which is to provide a ground to the signal lines 121 and 122, may include conductor patterns made of at least one or a mixture of at least two selected from the group consisting of silver (Ag), palladium (Pd), aluminum (Al), nickel (Ni), titanium (Ti), gold (Au), copper (Cu), and platinum (Pt) having excellent electrical conductivity, similar to the signal lines 121 and 122.

Here, the ground part 130 may include an impedance adjusting part and a dummy part.

The impedance adjusting part, which may adjust an impedance of the printed circuit board 100, may include conductor patterns having a path longer than those of the signal lines 121 and 122.

In addition, the dummy part may include a plurality of dummy patterns that are unrelated to an electrical connection, wherein the dummy patterns may be formed of conductors made of at least one or a mixture of at least two selected from the group consisting of silver (Ag), palladium (Pd), aluminum (Al), nickel (Ni), titanium (Ti), gold (Au), copper (Cu), and platinum (Pt), similar to the conductor patterns.

Examples of the conductor pattern and the dummy pattern included in the ground part 130 as the impedance adjusting part and the dummy part as described above are shown in FIGS. 2A to 9.

Among them, FIGS. 2A to 8 show examples of a conductor pattern including a plurality of unit patterns having an open curve shape and a dummy pattern depending on the conductor pattern. An example of a conductor pattern 131-1 shown in FIGS. 2A and 2B will be first described. The conductor pattern 131-1 may include a plurality of unit patterns A, B, C . . . formed so as to intersect (in the plan view shown in the figure) with the above-mentioned signal lines 121 and 122. That is, the conductor pattern 131-1 and the above-mentioned signal lines 121 and 122 may be overlapped with each other in a direction perpendicular to a major surface of the insulating layer 110.

Figure 2A:
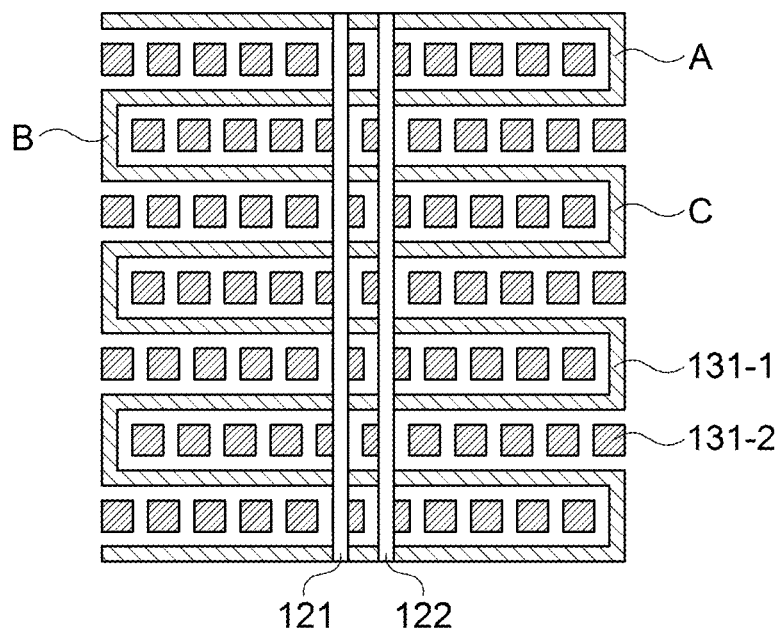
FIGS. 2A to 9 are illustrative views of a conductor pattern and a dummy pattern included in a ground part according to a first exemplary embodiment of the present disclosure.
Figure 2B:
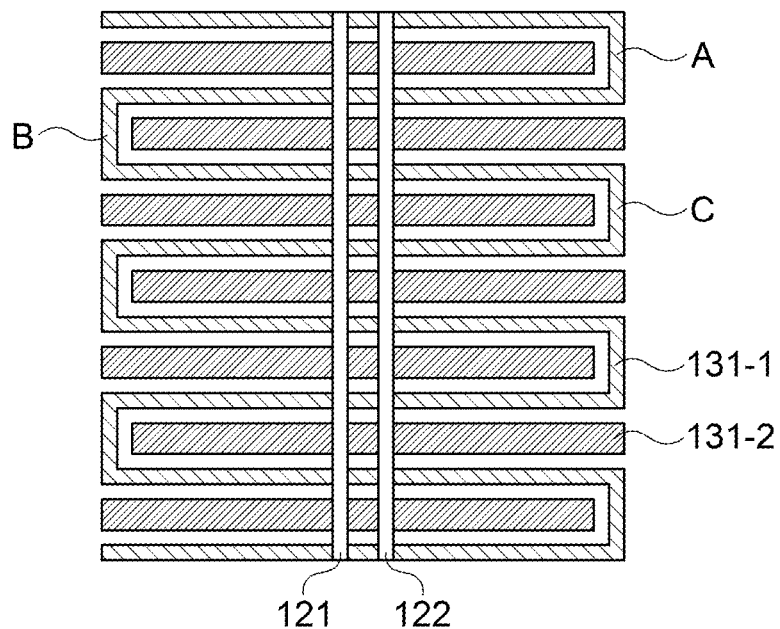

Here, the unit patterns A, B, C . . . may have the open curve shape. For example, the unit patterns A, B, C . . . of the conductor pattern 131-1 may have a U-shaped open curve shape, as shown in FIGS. 2A and 2B. However, the unit patterns A, B, C . . . according to the present disclosure are not limited to having the shape as shown in FIGS. 2A and 2B, but may also have any shape as long as they have the open curve shape.

In addition, in the conductor pattern 131-1, the plurality of unit patterns A, B, C . . . may be connected to each other to form one path. Therefore, the conductor pattern 131-1 having a tortuous shape as shown in FIGS. 2A and 2B may be formed.

Next, an example of a dummy pattern 131-2 shown in FIGS. 2A and 2B will be described. At least one dummy pattern 131-2 included in the ground part 130 as the dummy part 130-2 is disposed in a form in which it is enclosed by each of the unit patterns A, B, C . . . . That is, as shown in FIGS. 2A and 2B, each of the plurality of unit patterns A, B, C . . . encloses at least one dummy pattern 131-2.

Here, a size, a shape, a position, and the like, of the dummy pattern 131-2 may be variously changed as long as the dummy pattern 131-2 may be disposed in a form in which it is enclosed by each of the unit patterns A, B, C . . . .

Meanwhile, the conductor pattern 131-1 included in the ground part 130 as the impedance adjusting part may also be implemented in a form in which each of the plurality of unit patterns A, B, C . . . having the open curve shape includes at least one sub unit pattern a, b, c . . . , as shown in FIGS. 3 to 7.

FIGS. 3 to 6 show examples of a conductor pattern in which the sub unit patterns have an open curve shape and a dummy pattern depending on the conductor pattern. An example of a conductor pattern 132-1 shown in FIG. 3 will be first described. A basic structure of the conductor pattern 132-1 is similar to that of the conductor pattern 131-1 of FIGS. 2A and 2B.

Figure 3:
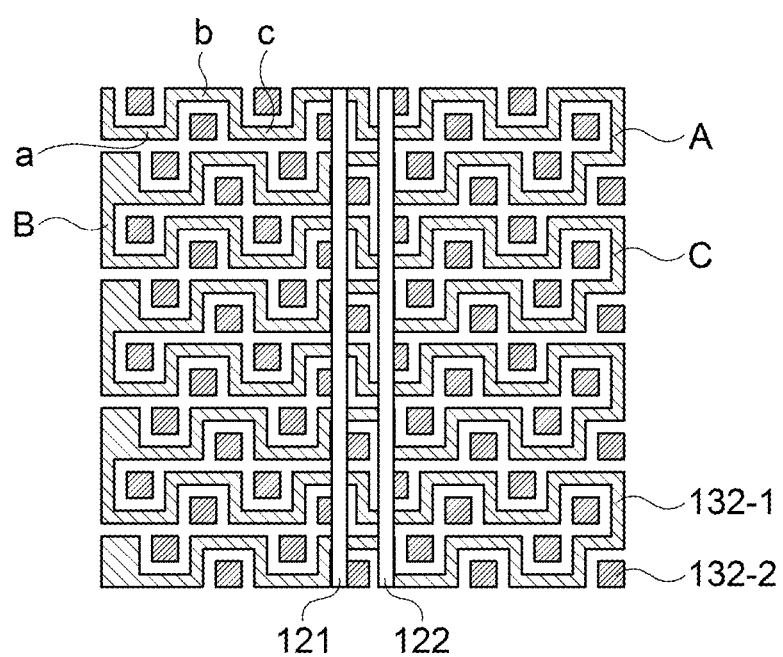

That is, the conductor pattern 132-1 of FIG. 3 may include a plurality of unit patterns A, B, C . . . formed so as to intersect with the above-mentioned signal lines 121 and 122. That is, the conductor pattern 132-1 and the above-mentioned signal lines 121 and 122 may be overlapped with each other in the direction perpendicular to the major surface of the insulating layer 110. Here, the unit patterns A, B, C . . . may have an open curve shape.

In addition, in the conductor pattern 132-1, the plurality of unit patterns A, B, C . . . may be connected to each other to form one path. Therefore, the conductor pattern 132-1 may be formed in a tortuous shape as shown in FIG. 3.

However, in the conductor pattern 132-1 of FIG. 3, the respective unit patterns A, B, C . . . may be implemented in a form in which they include at least one sub unit pattern a, b, c . . . having an open curve shape, unlike the conductor pattern 131-1 of FIGS. 2A and 2B.

Although the case in which the unit patterns A, B, C . . . include a plurality of sub unit patterns a, b, c . . . having the open curve shape has been shown in FIG. 3, the present disclosure is not limited thereto. That is, the unit patterns A, B, C . . . may include only one sub unit pattern having the open curve shape.

In the conductor pattern 132-1 configured as described above, as shown in FIG. 3, the unit patterns A, B, C . . . include at least one sub unit pattern a, b, c . . . having the open curve shape, such that the conductor pattern 132-1 may be formed in a shape more tortuous than that of the conductor pattern 131-1 of FIGS. 2A and 2B.

In addition, the sub unit patterns a, b, c . . . may have, for example, a U shape, as shown in FIG. 3. However, the present disclosure is not limited thereto. That is, the sub unit patterns may have any shape as long as they may be included in the unit patterns.

Next, an example of a dummy pattern 132-2 shown in FIG. 3 will be described. A basic structure of the dummy pattern 132-2 is similar to that of the dummy pattern 131-2 of FIGS. 2A and 2B. That is, each of the plurality of unit patterns A, B, C . . . encloses at least one dummy pattern 132-2.

However, in the case of FIG. 3, each of the sub unit patterns a, b, c . . . having the open curve shape encloses at least one dummy pattern 132-2, such that a form in which each of the plurality of unit patterns A, B, C . . . encloses at least one dummy pattern 132-2 may be taken.

Here, a size, a shape, a position, and the like, of the dummy pattern 132-2 may be variously changed as long as the dummy pattern 132-2 may be disposed in a form in which it is enclosed by each of the sub unit patterns a, b, c . . . .

Although the case in which each of the sub unit patterns a, b, c . . . having the open curve shape encloses only one dummy pattern has been shown in FIG. 3, the present disclosure is not limited thereto. The sub unit patterns a, b, c . . . may also enclose a plurality of dummy patterns.

Figure 4:
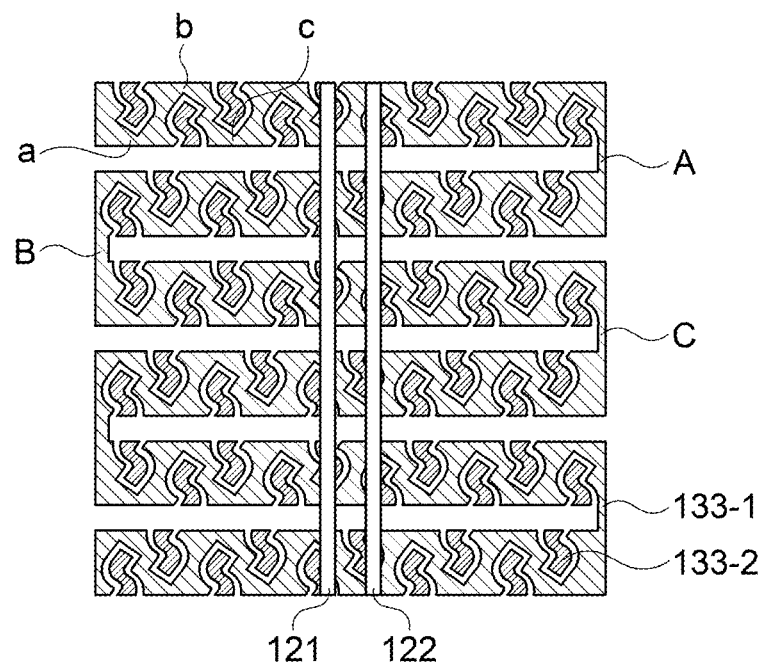

Meanwhile, in a conductor pattern 133-1 and a dummy pattern 133-2 shown in FIG. 4, an example of the conductor pattern 133-1 will be first described. A basic structure of the conductor pattern 133-1 is similar to that of the conductor pattern 132-1 of FIG. 3.

That is, the conductor pattern 133-1 of FIG. 4 may include a plurality of unit patterns A, B, C . . . formed so as to intersect with the above-mentioned signal lines 121 and 122. That is, the conductor pattern 133-1 and the above-mentioned signal lines 121 and 122 may be overlapped with each other in the direction perpendicular to the major surface of the insulating layer 110. Here, the unit patterns A, B, C . . . may have an open curve shape.

In addition, in the conductor pattern 133-1, the plurality of unit patterns A, B, C . . . may be connected to each other to form one path. Therefore, the conductor pattern 133-1 may be formed in a tortuous shape as shown in FIG. 4.

In addition, each of the unit patterns A, B, C . . . of the conductor pattern 133-1 may be implemented in a form in which it includes at least one sub unit pattern a, b, c . . . having an open curve shape.

Although the case in which the unit patterns A, B, C . . . include a plurality of sub unit patterns a, b, c . . . having the open curve shape has been shown in FIG. 4, the present disclosure is not limited thereto. That is, the unit patterns A, B, C . . . may include only one sub unit pattern having the open curve shape.

In the conductor pattern 133-1 configured as described above, as shown in FIG. 4, the unit patterns A, B, C . . . include at least one sub unit pattern a, b, c . . . having the open curve shape, such that the conductor pattern 133-1 may be formed in a shape more tortuous than that of the conductor pattern 131-1 of FIGS. 2A and 2B, similar to FIG. 3.

However, the sub unit patterns a, b, c . . . may form non-pattern regions having a S shape unlike the sub unit patterns of FIG. 3 forming non-pattern regions having a U shape. However, the present disclosure is not limited thereto. That is, the sub unit patterns may have any shape as long as they may be included in the unit patterns A, B, C . . . .

Next, an example of a dummy pattern 133-2 shown in FIG. 4 will be described. A basic structure of the dummy pattern 133-2 is similar to that of the dummy pattern 132-2 of FIG. 3. That is, each of the sub unit patterns a, b, c . . . having the open curve shape encloses at least one dummy pattern 133-2, such that a form in which each of the plurality of unit patterns A, B, C . . . encloses at least one dummy pattern 133-2 is taken.

However, the non-pattern regions (for example, the non-pattern regions having the S shape) different from those formed by the sub unit patterns of FIG. 3 are formed by the sub unit patterns a, b, c . . . of the FIG. 4. Therefore, a shape of the dummy pattern 133-2 enclosed by the sub unit patterns a, b, c . . . is also different from that of the dummy pattern 132-2 of FIG. 3.

In addition, a size, a shape, a position, and the like, of the dummy pattern 133-2 may be variously changed as long as the dummy pattern 133-2 may be disposed in a form in which it is enclosed by each of the sub unit patterns a, b, c . . . , as described above.

In addition, although the case in which each of the sub unit patterns a, b, c . . . having the open curve shape encloses only one dummy pattern has been shown in FIG. 4, the present disclosure is not limited thereto. The sub unit patterns a, b, c . . . may also enclose a plurality of dummy patterns.

Figure 5:
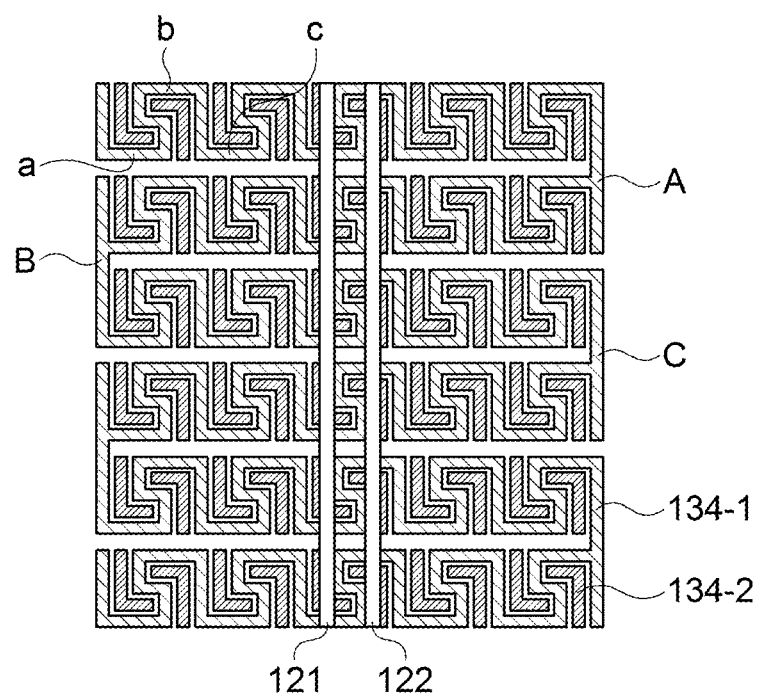

Meanwhile, in a conductor pattern 134-1 and a dummy pattern 134-2 shown in FIG. 5, an example of the conductor pattern 134-1 shown in FIG. 5 will be first described. A basic structure of the conductor pattern 134-1 is similar to those of the conductor patterns 132-1 and 133-1 of FIGS. 3 and 4.

That is, the conductor pattern 134-1 of FIG. 5 may include a plurality of unit patterns A, B, C . . . formed so as to intersect with the above-mentioned signal lines 121 and 122. That is, the conductor pattern 134-1 and the above-mentioned signal lines 121 and 122 may be overlapped with each other in the direction perpendicular to the major surface of the insulating layer 110. Here, the unit patterns A, B, C . . . may have an open curve shape.

In addition, in the conductor pattern 134-1, the plurality of unit patterns A, B, C . . . may be connected to each other to form one path. Therefore, the conductor pattern 134-1 may be formed in a tortuous shape as shown in FIG. 5.

In addition, each of the unit patterns A, B, C . . . of the conductor pattern 134-1 may be implemented in a form in which it includes at least one sub unit pattern a, b, c . . . having an open curve shape.

Although the case in which the unit patterns A, B, C . . . include a plurality of sub unit patterns a, b, c . . . having the open curve shape has been shown in FIG. 5, the present disclosure is not limited thereto. That is, the unit patterns A, B, C . . . may include only one sub unit pattern having the open curve shape.

In the conductor pattern 134-1 configured as described above, as shown in FIG. 5, the unit patterns A, B, C . . . include at least one sub unit pattern a, b, c . . . having the open curve shape, such that the conductor pattern 134-1 may be formed in a shape more tortuous than that of the conductor pattern 131-1 of FIGS. 2A and 2B, similar to FIGS. 3 and 4.

However, the sub unit patterns a, b, c . . . of the conductor pattern 134-1 may form non-pattern regions having a L shape or a ] shape, unlike FIGS. 3 and 4. However, the present disclosure is not limited thereto. That is, the sub unit patterns may have any shape as long as they may be included in the unit patterns A, B, C . . . .

Next, an example of a dummy pattern 134-2 shown in FIG. 5 will be described. A basic structure of the dummy pattern 134-2 is similar to those of the dummy patterns 132-2 and 133-2 of FIGS. 3 and 4. That is, each of the sub unit patterns a, b, c . . . having the open curve shape encloses at least one dummy pattern 134-2, such that a form in which each of the plurality of unit patterns A, B, C . . . encloses at least one dummy pattern 134-2 is taken.

However, the non-pattern regions (for example, the non-pattern regions having the L shape or the ] shape) different from those formed by the sub unit patterns of FIGS. 3 and 4 are formed by the sub unit patterns a, b, c . . . of the FIG. 5. Therefore, a shape of the dummy pattern 134-2 enclosed by the sub unit patterns a, b, c . . . is also different from those of the dummy patterns 132-2 and 133-2 of FIGS. 3 and 4.

In addition, a size, a shape, a position, and the like, of the dummy pattern 134-2 may be variously changed as long as the dummy pattern 134-2 may be disposed in a form in which it is enclosed by each of the sub unit patterns a, b, c . . . , as described above.

In addition, although the case in which each of the sub unit patterns a, b, c . . . having the open curve shape encloses only one dummy pattern has been shown in FIG. 5, the present disclosure is not limited thereto. The sub unit patterns a, b, c . . . may also enclose a plurality of dummy patterns.

Figure 6:
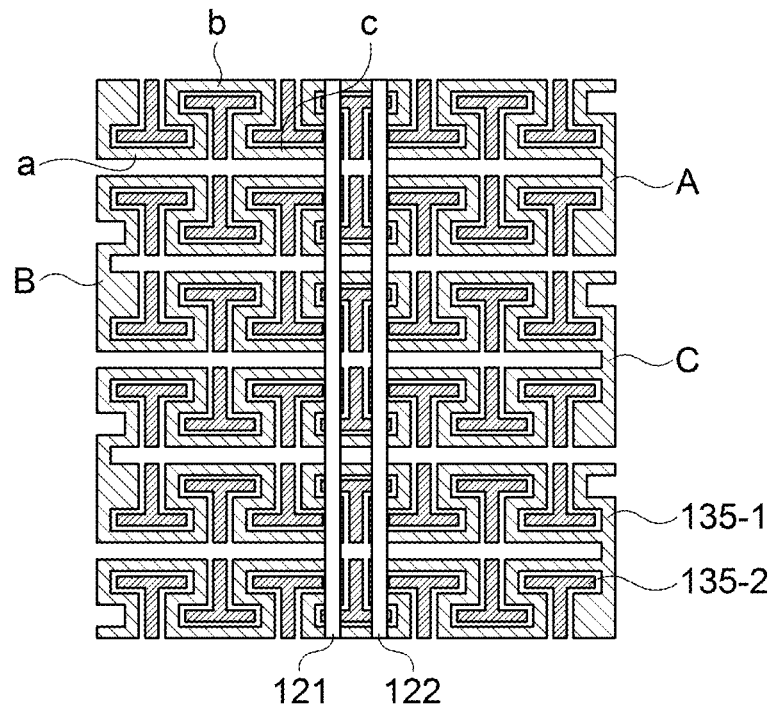

Meanwhile, in a conductor pattern 135-1 and a dummy pattern 135-2 shown in FIG. 6, an example of the conductor pattern 135-1 shown in FIG. 6 will be first described. A basic structure of the conductor pattern 135-1 is similar to those of the conductor patterns 132-1 to 134-1 of FIGS. 3 to 5.

That is, the conductor pattern 135-1 of FIG. 6 may include a plurality of unit patterns A, B, C . . . formed so as to intersect with the above-mentioned signal lines 121 and 122. That is, the conductor pattern 135-1 and the above-mentioned signal lines 121 and 122 may be overlapped with each other in the direction perpendicular to the major surface of the insulating layer 110. Here, the unit patterns A, B, C . . . may have an open curve shape.

In addition, in the conductor pattern 135-1, the plurality of unit patterns A, B, C . . . may be connected to each other to form one path. Therefore, the conductor pattern 135-1 may be formed in a tortuous shape as shown in FIG. 6.

In addition, each of the unit patterns A, B, C . . . of the conductor pattern 135-1 may be implemented in a form in which it includes at least one sub unit pattern a, b, c . . . having an open curve shape.

Although the case in which the unit patterns A, B, C . . . include a plurality of sub unit patterns a, b, c . . . having the open curve shape has been shown in FIG. 6, the present disclosure is not limited thereto. That is, the unit patterns A, B, C . . . may include only one sub unit pattern having the open curve shape.

In the conductor pattern 135-1 configured as described above, as shown in FIG. 6, the unit patterns A, B, C . . . include at least one sub unit pattern a, b, c . . . having the open curve shape, such that the conductor pattern 134-1 may be formed in a shape more tortuous than that of the conductor pattern 131-1 of FIGS. 2A and 2B, similar to FIGS. 3 to 5.

However, the sub unit patterns a, b, c . . . of the conductor pattern 135-1 may form non-pattern regions having a ⊥ shape or a T shape, unlike FIGS. 3 to 5. However, the present disclosure is not limited thereto. That is, the sub unit patterns may have any shape as long as they may be included in the unit patterns A, B, C . . . .

Next, an example of a dummy pattern 135-2 shown in FIG. 6 will be described. A basic structure of the dummy pattern 135-2 is similar to those of the dummy patterns 132-2 to 134-2 of FIGS. 3 to 5. That is, each of the sub unit patterns a, b, c . . . having the open curve shape encloses at least one dummy pattern 135-2, such that a form in which each of the plurality of unit patterns A, B, C . . . encloses at least one dummy pattern 135-2 is taken.

However, the non-pattern regions (for example, the non-pattern regions having the ⊥ shape or the T shape) different from those formed by the sub unit patterns of FIGS. 3 to 5 are formed by the sub unit patterns a, b, c . . . of the FIG. 6. Therefore, a shape of the dummy pattern 135-2 enclosed by the sub unit patterns a, b, c . . . is also different from those of the dummy patterns 132-2 to 134-2 of FIGS. 3 to 5.

In addition, a size, a shape, a position, and the like, of the dummy pattern 135-2 may be variously changed as long as the dummy pattern 135-2 may be disposed in a form in which it is enclosed by each of the sub unit patterns a, b, c . . . , as described above.

In addition, although the case in which each of the sub unit patterns a, b, c . . . having the open curve shape encloses only one dummy pattern has been shown in FIG. 6, the present disclosure is not limited thereto. The sub unit patterns a, b, c . . . may also enclose a plurality of dummy patterns.

Figure 7:
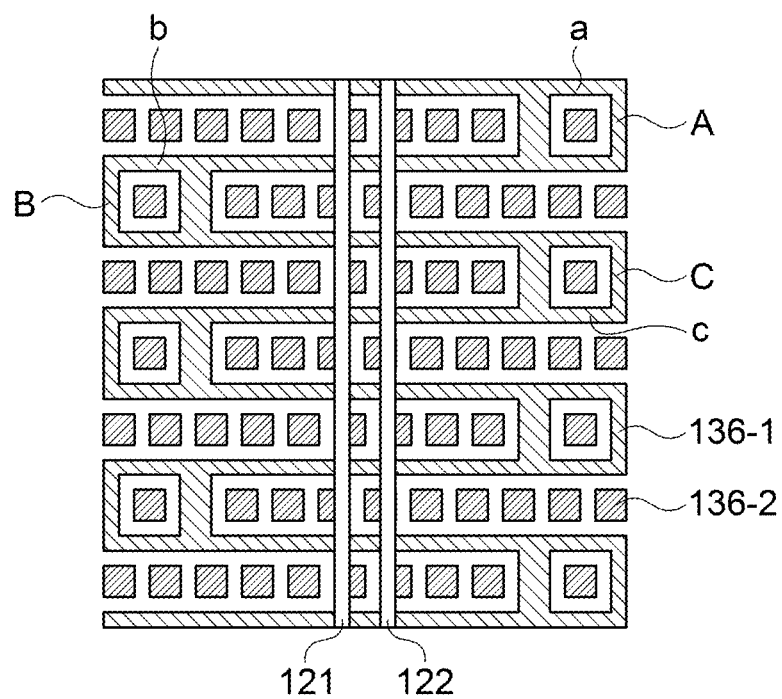

Meanwhile, FIG. 7 shows an example a conductor pattern in which sub unit patterns a, b, c . . . included in each of a plurality of unit patterns A, B, C . . . having an open curved shape have a closed curve shape and a dummy pattern depending on the conductor pattern.

An example of a conductor pattern 136-1 shown in FIG. 7 will be first described. A basic structure of the conductor pattern 136-1 is similar to those of the conductor patterns 131-1 to 135-1 of FIGS. 2A to 6.

That is, the conductor pattern 136-1 of FIG. 7 may include a plurality of unit patterns A, B, C . . . formed so as to intersect with the above-mentioned signal lines 121 and 122. That is, the conductor pattern 136-1 and the above-mentioned signal lines 121 and 122 may be overlapped with each other in the direction perpendicular to the major surface of the insulating layer 110. Here, the unit patterns A, B, C . . . may have the open curve shape.

In addition, in the conductor pattern 136-1, the plurality of unit patterns A, B, C . . . may be connected to each other to form one path. Therefore, the conductor pattern 136-1 may be formed in a tortuous shape as shown in FIG. 7.

However, in the conductor pattern 136-1 of FIG. 7, the respective unit patterns A, B, C . . . may be implemented in a form in which they include at least one sub unit pattern a, b, c . . . having the closed curve shape, unlike the conductor patterns 131-1 to 135-1 of FIGS. 2A to 6.

Although the case in which the unit patterns A, B, C . . . include only one sub unit pattern a, b, c . . . having the closed curve shape has been shown in FIG. 7, the present disclosure is not limited thereto. That is, the unit patterns A, B, C . . . may include a plurality of sub unit patterns having the closed curve shape.

In the conductor pattern 136-1 configured as described above, as shown in FIG. 7, the unit patterns A, B, C . . . include at least one sub unit pattern a, b, c . . . having the closed curve shape, such that the conductor pattern 136-1 may be formed in a shape more tortuous than that of the conductor pattern 131-1 of FIGS. 2A and 2B.

Next, an example of a dummy pattern 136-2 shown in FIG. 7 will be described. A basic structure of the dummy pattern 136-2 is similar to those of the dummy patterns 131-2 to 135-2 of FIGS. 2A to 6. That is, each of the plurality of unit patterns A, B, C . . . encloses at least one dummy pattern 136-2.

However, in the case of FIG. 7, the respective unit patterns A, B, C . . . having the open curve shape include at least one sub unit pattern a, b, c . . . having the closed curve shape, unlike FIGS. 2A to 6, such that the sub unit patterns a, b, c . . . having the closed curve shape have a form in which they enclose at least one dummy pattern 136-2.

Here, a size, a shape, a position, and the like, of the dummy pattern 136-2 may be variously changed as long as the dummy pattern 136-2 may be disposed in a form in which it is enclosed by each of the unit patterns A, B, C . . . having the open curve shape or each of the sub unit patterns a, b, c . . . having the closed curve shape.

Although the case in which each of the unit patterns A, B, C . . . having the open curve shape encloses a plurality of dummy patterns has been shown in FIG. 7, the present disclosure is not limited thereto. The unit patterns A, B, C . . . may also enclose only one dummy pattern.

In addition, although the case in which each of the sub unit patterns a, b, c . . . having the closed curve shape encloses only one dummy pattern has been shown in FIG. 7, the present disclosure is not limited thereto. The sub unit patterns a, b, c . . . may also enclose a plurality of dummy patterns.

Figure 8:
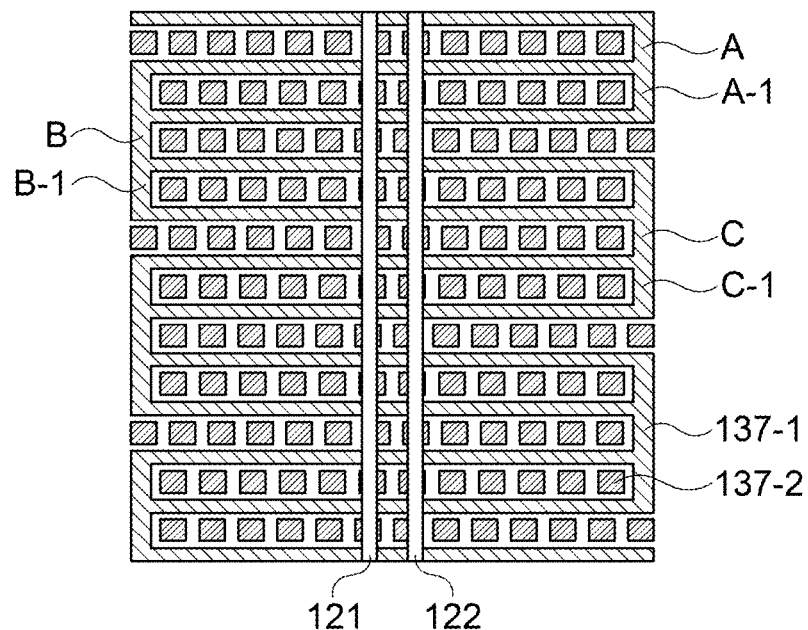

Meanwhile, FIG. 8 shows an example of a conductor pattern in which a unit pattern having a closed curve shape is disposed between a plurality of unit patterns having an open curve shape and a dummy pattern depending on the conductor pattern.

An example of a conductor pattern 137-1 shown in FIG. 8 will be first described. The conductor pattern 137-1 may be implemented in a form in which at least one unit pattern A-1, B-1 . . . having a closed curve shape is disposed between a plurality of unit patterns A, B, C . . . having an open curve shape, as shown in FIG. 8. A basic structure of the conductor pattern 137-1 is similar to those of the conductor patterns 131-1 to 136-1 of FIGS. 2A to 7.

That is, the conductor pattern 137-1 of FIG. 8 may include a plurality of unit patterns A, B, C . . . formed so as to intersect with the above-mentioned signal lines 121 and 122. That is, the conductor pattern 137-1 and the above-mentioned signal lines 121 and 122 may be overlapped with each other in the direction perpendicular to the major surface of the insulating layer 110. Here, the unit patterns A, B, C . . . may have the open curve shape.

In addition, in the conductor pattern 137-1, the plurality of unit patterns A, B, C . . . may be connected to each other to form one path. Therefore, the conductor pattern 137-1 may be formed in a tortuous shape as shown in FIG. 8.

However, the conductor pattern 137-1 of FIG. 8 may be implemented in the form in which at least one unit pattern A-1, B-1 . . . having the closed curve shape is disposed between the unit patterns A, B, C . . . having the open curve shape, unlike the conductor patterns 131-1 to 136-1 of FIGS. 2A to 7.

Although the case in which only one unit pattern A-1, B-1 . . . having the closed curve shape is disposed between the unit patterns A, B, C . . . has been shown in FIG. 8, the present disclosure is not limited thereto. That is, a plurality of unit patterns having the closed curve shape are disposed between the unit patterns A, B, C . . . .

In the conductor pattern 137-1 configured as described above, as shown in FIG. 8, at least one unit pattern A-1, B-1 . . . having the closed curve shape is disposed between the unit patterns A, B, C . . . , such that the conductor pattern 137-1 may be formed in a shape more tortuous than that of the conductor pattern 131-1 of FIGS. 2A and 2B.

Next, an example of a dummy pattern 137-2 shown in FIG. 8 will be described. A basic structure of the dummy pattern 137-2 is similar to those of the dummy patterns 131-2 to 136-2 of FIGS. 2A to 7. That is, each of the plurality of unit patterns A, B, C . . . encloses at least one dummy pattern 137-2.

However, in the case of FIG. 8, at least one unit pattern A-1, B-1 . . . having the closed curve shape is disposed between the unit patterns A, B, C . . . having the open curve shape, unlike FIGS. 2A to 7, such that the unit patterns A-1, B-1 . . . having the closed curve shape have a form in which they enclose at least one dummy pattern 137-2.

Here, a size, a shape, a position, and the like, of the dummy pattern 137-2 may be variously changed as long as the dummy pattern 137-2 may be disposed in a form in which the dummy pattern 137-2 is enclosed by each of the unit patterns A, B, C . . . having the open curve shape and each of the unit patterns A-1, B-1 . . . having the closed curve shape.

Although the case in which each of the unit patterns A, B, C . . . having the open curve shape encloses a plurality of dummy patterns 137-2 has been shown in FIG. 8, the present disclosure is not limited thereto. The unit patterns A, B, C . . . may also enclose only one dummy pattern.

In addition, although the case in which each of the unit patterns A-1, B-1 . . . having the closed curve shape encloses the plurality of dummy patterns 137-2 has been shown in FIG. 8, the present disclosure is not limited thereto. The unit patterns A-1, B-1 . . . may also enclose only one dummy pattern.

Figure 9:
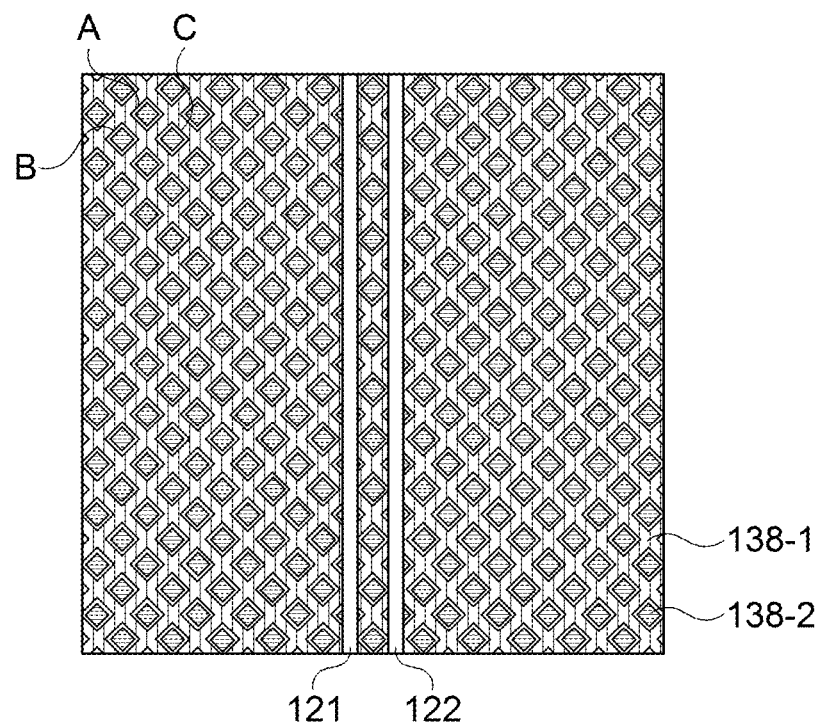

Meanwhile, FIG. 9 shows an example of a conductor pattern including a plurality of unit patterns having a closed curve shape and a dummy pattern depending on the conductor pattern.

An example of a conductor pattern 138-1 shown in FIG. 9 will be first described. The conductor pattern 138-1 is similar to the conductor patterns 131-1 to 137-1 of FIGS. 2A to 8 in that it may include a plurality of unit patterns A, B, C . . . formed so as to intersect with the above-mentioned signal lines 121 and 122. That is, the conductor pattern 138-1 and the above-mentioned signal lines 121 and 122 may be overlapped with each other in the direction perpendicular to the major surface of the insulating layer 110.

However, in the conductor pattern 138-1 of FIG. 9, the respective unit patterns A, B, C . . . may be implemented in the closed curve shape, unlike the conductor patterns 131-1 to 137-1 of FIGS. 2A to 8.

Here, although the plurality of unit patterns A, B, C . . . having the closed curve shape corresponding to a rhombus have been shown in FIG. 9, the unit patterns A, B, C . . . according to the present disclosure are not limited to having the shape as shown in FIG. 9, but may have any shape as long as they have the closed curve shape.

Next, an example of a dummy pattern 138-2 shown in FIG. 9 will be described. The dummy pattern 138-2 is similar to the dummy patterns 131-2 to 137-2 of FIGS. 2A to 8 in that each of the plurality of unit patterns A, B, C . . . encloses at least one dummy pattern 138-2.

However, in the case of FIG. 9, the conductor pattern 138-1 includes the plurality of unit patterns A, B, C . . . having the closed curve shape, unlike FIG. 2A to 8, such that each of the unit patterns A, B, C . . . having the closed curve shape encloses at least one dummy pattern 138-2.

Here, a size, a shape, a position, and the like, of the dummy pattern 138-2 may be variously changed as long as the dummy pattern 138-2 may be disposed in a form in which it is enclosed by each of the unit patterns A, B, C . . . having the closed curve shape.

Although the case in which each of the unit patterns A, B, C . . . having the closed curve shape encloses only one dummy pattern 138-2 has been shown in FIG. 9, the present disclosure is not limited thereto. The unit patterns A, B, C . . . may also enclose a plurality of dummy patterns.

As described above, in the printed circuit board 100 according to the present exemplary embodiment, the conductor pattern (ground pattern) included in the ground part 130 may have the shapes shown in FIGS. 2A to 9.

As described above, the printed circuit board 100 according to the present exemplary embodiment may have a signal transmitting trace (for example, the signal transmitting lines 121 and 122 shown in FIGS. 2A to 9), a ground part including a continuous trace (for example, the conductor pattern 131-1 of FIGS. 2A and 2B, the conductor patterns 132-1 of FIG. 3, the conductor pattern 133-1 of FIG. 4, the conductor pattern 134-1 of FIG. 5, the conductor pattern 135-1 of FIG. 5, the conductor pattern 136-1 of FIG. 7, the conductor pattern 137-1 of FIG. 8, and the conductor pattern 138-1 of FIG. 9) and a plurality of discrete patterns spaced-apart from the continuous trace (for example, the conductor pattern 131-2 of FIGS. 2A and 2B, the conductor patterns 132-2 of FIG. 3, the conductor pattern 133-2 of FIG. 4, the conductor pattern 134-2 of FIG. 5, the conductor pattern 135-2 of FIG. 5, the conductor pattern 136-2 of FIG. 7, the conductor pattern 137-2 of FIG. 8, and the conductor pattern 138-2 of FIG. 9); and an insulating layer (for example, the insulating layer 110 of FIGS. 1A and 1B) disposed between the signal transmitting trace and ground part. The plurality of discrete patterns may be dispersed among regions defined by boundaries of the continuous trace. The signal transmitting trace and the ground part may overlap with each other.

As shown in FIGS. 2A to 9, ends of a portion of the signal transmitting trace and ends of a portion of the continuous trace overlap with each other, and a length of the portion of the signal transmitting trace may be less than a length of the portion of the continuous trace.

As shown in FIGS. 2A to 8, the continuous trace may include a plurality of first traces crossing the signal transmitting trace and a plurality of second traces connecting the plurality of first traces.

As shown in FIGS. 3 to 6, each of the plurality of first traces may include a plurality of curved portions and has a zigzag shape. The plurality of the discrete patterns may be partially surrounded by the plurality of curved portions. Boundaries of the plurality of curved portions may define a plurality of regions having a shape selected from the group consisting of T-shape, L-shape, S-shape, and quadrilateral, and the plurality of discrete patterns having a same shape as the plurality of regions may be disposed in the plurality of regions defined by the boundaries of the plurality of curved portions.

As show in FIG. 7, the continuous trace may further include a plurality of third traces disposed adjacent to the plurality of the second traces and connecting the plurality of first traces. At least one of the plurality of discrete patterns is surrounded by two of the plurality of first traces that are adjacent to each other, one of the plurality of second traces, and one of the plurality of the third trace.

As shown in FIG. 8, the continuous trace may further include a plurality of fourth traces crossing the signal transmitting trace and extending between two of the plurality of second traces.

Therefore, in the printed circuit board 100 according to the present exemplary embodiment, a length of a signal feedback path in the ground part 130 may be adjusted using the shape of the ground pattern as described above, such that an impedance may be adjusted, which will be described later.

In addition, in the printed circuit board 100 according to the present exemplary embodiment described above, the dummy pattern is implemented together with the ground pattern as described above in a ground region, thereby making it possible to increase a ratio of a conductor in the ground region. Therefore, in the printed circuit board 100 according to the present exemplary embodiment, the impedance may be adjusted, and warpage preventing characteristics may be improved.

Figure 10A:
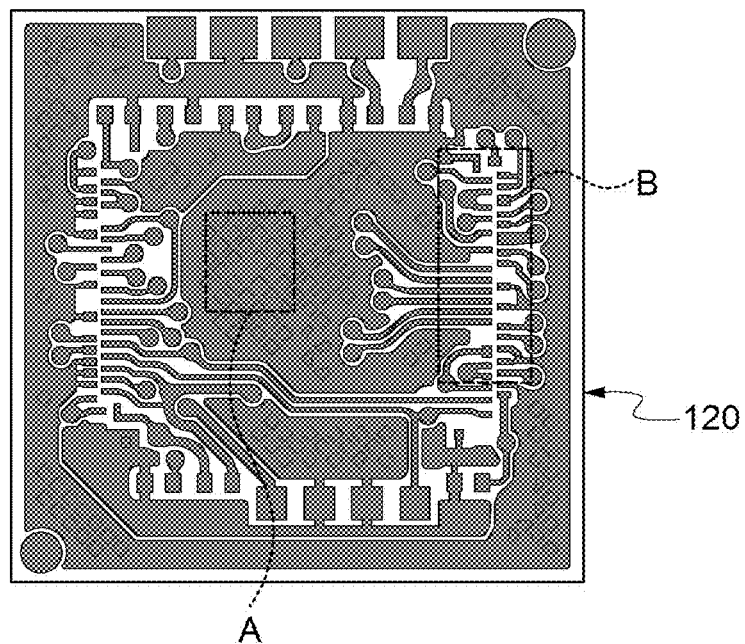
FIG. 10A is an illustrative plan view of a signal transmitting part according to a first exemplary embodiment of the present disclosure.
Figure 10B:
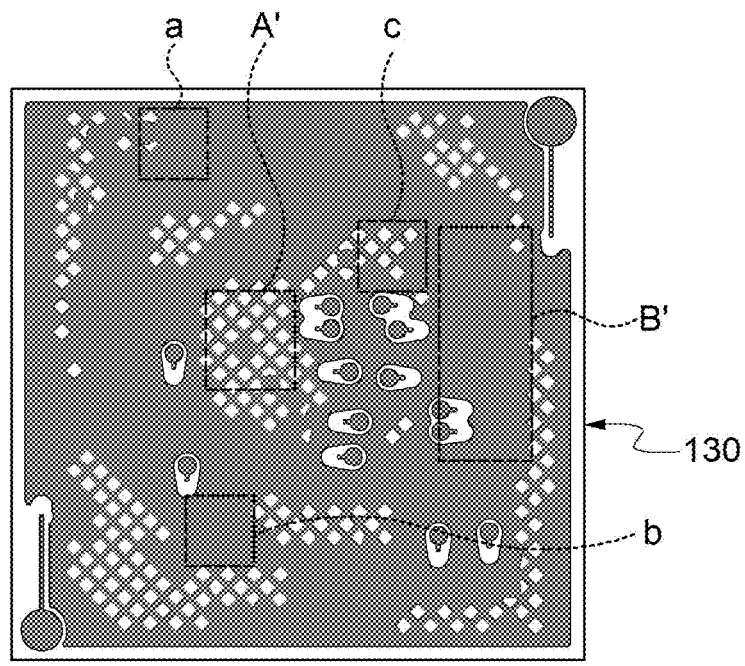
FIG. 10B is an illustrative plan view of the ground part according to a first exemplary embodiment of the present disclosure.

Meanwhile, FIG. 10A is an illustrative plan view of a signal transmitting part 120 according to the present exemplary embodiment; and FIG. 10B is an illustrative plan view of the ground part 130 according to the present exemplary embodiment. In FIGS. 10A and 10B, a hatched portion indicates a portion that is occupied by conductors, and a non-hatched portion indicates a portion that is not occupied by the conductors.

As shown in FIGS. 10A and 10B, in a ground part region A' corresponding to a signal transmitting part region A in which a ratio of conductors such as circuit patterns, or the like, is relatively high, conductor patterns and dummy patterns may be formed so that a ratio of conductors is relatively low.

In addition, in a ground part region B' corresponding to a signal transmitting part region B in which a ratio of conductors is relatively low, conductor patterns and dummy patterns may be formed so that a ratio of conductors is relatively high.

The conductor patterns and the dummy patterns are included in the ground part 130 in the above-mentioned configuration, such that a deviation between the ratios of the conductors formed in a first corresponding region A-A' of the signal transmitting part 120 and the ground part 130 and a second corresponding region B-B' of the signal transmitting part 120 and the ground part 130 is minimized. Similarly, a deviation between ratios of conductors formed in each corresponding region other than the first and second corresponding regions A-A' and B-B' may also be minimized.

That is, the conductor patterns and the dummy patterns according to the present exemplary embodiment are included in the ground part 130 in a configuration as shown in FIG. 10B, such that the conductor patterns and the dummy patterns may be formed so that a deviation between ratios of conductors in each corresponding region of the signal transmitting part 120 and the ground part 130 is minimized.

In other words, in the present exemplary embodiment, the ratio of the conductors in the ground part implemented on a board may be configured to have a minimum deviation with respect to signal patterns.

Therefore, in the case in which the conductor patterns and the dummy patterns according to the present exemplary embodiment are included in the ground part 130 in the configuration as shown in FIG. 10B, non-uniformity of the ratios of the conductors between the signal transmitting part 120 and the ground part 130, that is, non-uniformity of the ratios of the conductors between upper and lower layers of the printed circuit board 100 in the present exemplary embodiment may be improved.

Therefore, generation of warpage in the printed circuit board 100 due to the non-uniformity as described above may be decreased, such that warpage preventing characteristics may be more significantly improved, which will be described later.

Figure 11:
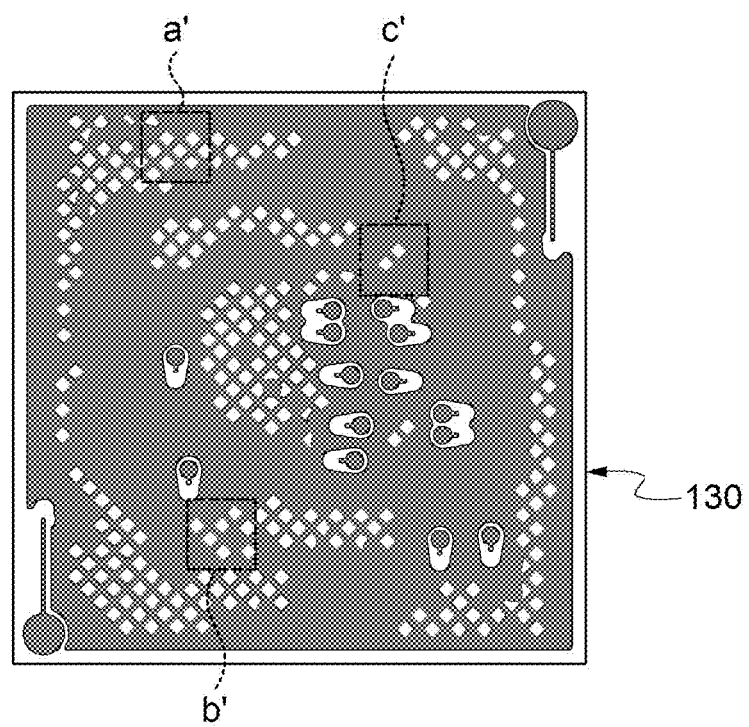
FIG. 11 is a view showing a form in which ratios of conductors are adjusted for each region in the ground part of FIG. 10B.

FIG. 11 is a view showing a form in which ratios of conductors are adjusted for each region in the ground part 130 of FIG. 10B. In FIG. 11, similar to FIGS. 10A and 10B, a hatched portion indicates a portion that is occupied by conductors such as the conductor pattern, the dummy pattern, and the like, and a non-hatched portion indicates a portion that is not occupied by the conductors.

As shown in FIGS. 10B, and 11, in ground part regions (See the regions represented by a and b of FIG. 10B) in which a ratio of conductors is relatively high, conductor patterns and dummy patterns may be formed so that the ratio of the conductors is relatively low (See the regions represented by a' and b' of FIG. 11).

In addition, in a ground part region (See the region represented by c of FIG. 10B) in which a ratio of conductors is relatively low, conductor patterns and dummy patterns may be formed so that a ratio of conductors is relatively high (See the region represented by c' of FIG. 11).

The conductor patterns and the dummy patterns are included in the ground part 130 of FIG. 10B in a configuration as shown in FIG. 11, such that a deviation between ratios of conductors formed in each region of the ground part 130 may be minimized.

That is, in the case in which the conductor patterns and the dummy patterns are included in the ground part 130 of FIG. 10B in a configuration as shown in FIG. 11, a deviation between ratios of conductors in each corresponding region of the signal transmitting part 120 and the ground part 130 may be minimized and a deviation between ratios of conductors in each region of the ground part 130 may be minimized.

In other words, in the present exemplary embodiment, the ratio of the conductors in a ground region implemented on the board may be configured to have a minimum deviation with respect to the signal patterns, and be configured to have a minimum deviation with respect to adjacent conductors of the ground region.

Therefore, in the case in which the conductor patterns and the dummy patterns are included in the ground part 130 of FIG. 10B in a configuration as shown in FIG. 11, non-uniformity of the ratios of the conductors between the signal transmitting part 120 and the ground part 130 may be improved, and non-uniformity of the ratios of the conductors in each region of the ground part 130 may be improved.

Therefore, generation of warpage in the printed circuit board 100 due to the non-uniformity as described above may be decreased as compared with the case of FIG. 10B, such that warpage preventing characteristics may be more significantly improved as compared with the case of FIG. 10B, which will be described later.

<Second Exemplary Embodiment>

Figure 12A:
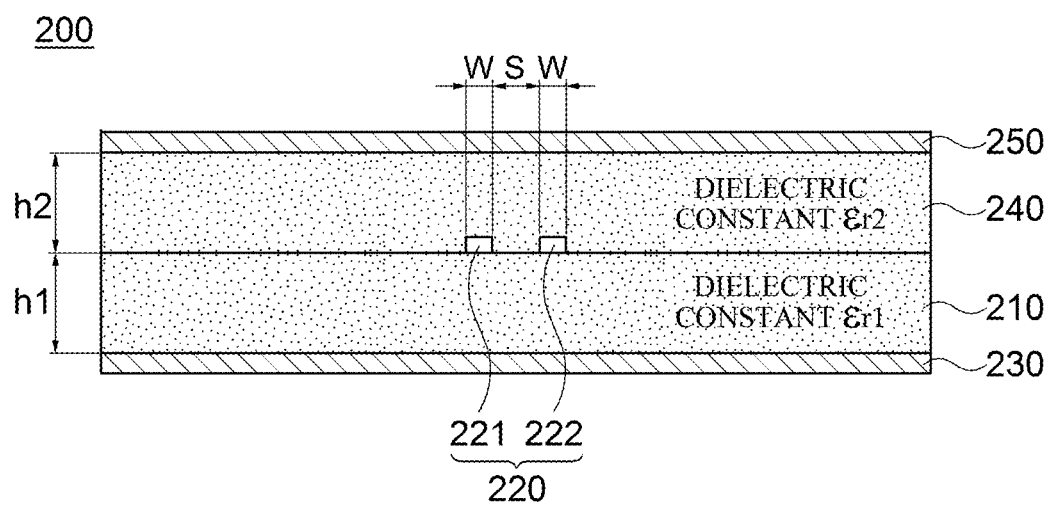
FIGS. 12A and 12B are cross-sectional views of a printed circuit board according to a second exemplary embodiment of the present disclosure.
Figure 12B:
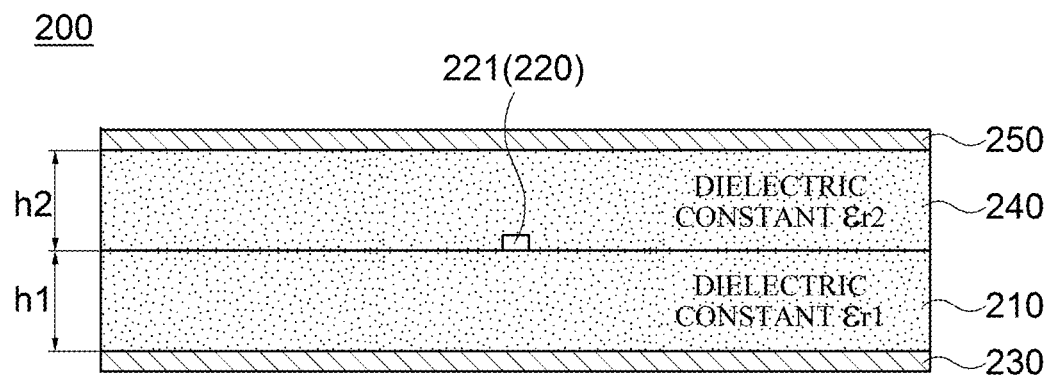

FIGS. 12A and 12B are cross-sectional views of a printed circuit board according to the present exemplary embodiment.

A printed circuit board 200 according to the present exemplary embodiment may include a signal transmitting part and a ground part disposed with an insulating layer interposed therebetween.

For example, as shown in FIG. 12A, a signal transmitting part 220 and a first ground part 230 may be disposed with a first insulating layer 210 interposed therebetween, and the signal transmitting part 220 and a second ground part 250 may be disposed with a second insulating layer 240 interposed therebetween. However, the present disclosure is not limited thereto, but may have any structure as long as the signal transmitting part and the ground part may be disposed with the insulating layer interposed therebetween.

The first insulating layer 210 according to the present exemplary embodiment may be made of a medium having a dielectric constant $\varepsilon_{r1}$, and may have a predetermined height h1 depending on a size of a product in which the printed circuit board 200 is used.

In addition, the second insulating layer 240 according to the present exemplary embodiment may be made of a medium having a dielectric constant $\varepsilon_{r2}$, and may have a predetermined height h2 depending on a size of a product in which the printed circuit board 200 is used.

Here, as the insulating layers 210 and 240, a resin insulating layer may be used, similar to a first exemplary embodiment, and as a material of the resin insulating layer, a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, a prepreg may be used. In addition, a thermosetting resin, a photo-curable resin, or the like, may be used. However, the present disclosure is not particularly limited thereto.

In addition, the insulating layers 210 and 240 according to the present exemplary embodiment may be made of the same material. However, the present disclosure is not limited thereto. That is, the insulating layers 210 and 240 may be made of different materials.

In addition, the printed circuit board 200 according to the present exemplary embodiment in which the insulating layers 210 and 240 as described above are used may be a single layer board formed of the insulating layer or a multilayer board in which a plurality of insulating layers and a plurality of circuit layers are alternately stacked, similar to a first exemplary embodiment.

Meanwhile, the signal transmitting part 220 according to the present exemplary embodiment may include at least one signal line, for example, a pair of signal lines 221 and 222 having a predetermined width W, disposed at a predetermined interval S, and extended in a length direction, as shown in FIG. 12A. The pair of signal lines 221 and 222 may be two lanes supporting a mobile industry processor interface (MIPI).

Here, the MIFI means a new standard of a serial interface for connecting a control signal between a processor and peripheral devices in a mobile device, and may be used for transmitting and receiving data between a mobile camera module and a main processor in the present exemplary embodiment.

Particularly, in the case in which impedance matching is not performed in signal lines used in the MIPI of the camera module, which are differential pair lines, signal transmission characteristics are deteriorated, such that a problem such as image noise, or the like, may occur.

However, the signal transmitting part 220 according to the present disclosure is not limited to having only a configuration of the signal lines (that is, the pair of signal lines) shown in FIG. 12A, but may have any configuration as long as it includes at least one signal line. Therefore, the signal transmitting part 220 according to the present exemplary embodiment may include one pair or more of signal lines or include only one signal line 221 as shown in FIG. 12B.

In addition, the signal lines 221 and 222, which are to transmit a control signal, or the like, may be formed of conductor patterns made of at least one or a mixture of at least two selected from the group consisting of silver (Ag), palladium (Pd), aluminum (Al), nickel (Ni), titanium (Ti), gold (Au), copper (Cu), and platinum (Pt) having excellent electrical conductivity.

Meanwhile, in the printed circuit board 200 according to the present exemplary embodiment, the insulating layers 210 and 240 are present between the signal lines 221 and 222 and the ground parts 230 and 250, thereby making it possible to prevent interference of a signal from an electromagnetic field generated due to concentration of alternating current (AC) energy at a high frequency.

In a structure of the signal lines 221 and 222 as in the present exemplary embodiment, impedance characteristics are affected by a line width W of the signal lines 221 and 222, heights h1 and h2 between the signal lines 221 and 222 and the ground parts 230 and 250, and permittivities $\varepsilon_{r1}$ and $\varepsilon_{r2}$ of media forming the insulating layers 210 and 240. At the high frequency, most of the energy components of the signal between the signal lines 221 and 222 and the ground parts 230 and 250 progress while being configured in an AC field form.

Therefore, the signal lines 221 and 222 are disposed on upper surfaces of the insulating layers 210 and 240 while having a predetermined line width W depending on a condition (heights h1 and h2/permittivities $\varepsilon_{r1}$ and $\varepsilon_{r2}$) of the insulating layers 210 and 240, thereby configuring a circuit.

In addition, the signal lines 221 and 222 may be formed by a photo etching method, or the like, and it is advantageous to form the signal lines 221 and 222 so as to have a thin line width W in the case in which an impedance is low since an influence depending on the line width of the signal lines 221 and 222 may not be ignored when a frequency becomes high.

Meanwhile, the ground parts 230 and 250 according to the present exemplary embodiment, which may be to provide a ground to the signal lines 221 and 222, may include conductor patterns made of at least one or a mixture of at least two selected from the group consisting of silver (Ag), palladium (Pd), aluminum (Al), nickel (Ni), titanium (Ti), gold (Au), copper (Cu), and platinum (Pt) having excellent electrical conductivity, similar to the signal lines 221 and 222.

Here, the ground parts 230 and 250 may include an impedance adjusting part and a dummy part, similar to a first exemplary embodiment. In this case, the impedance adjusting part may include conductor patterns having a path longer than those of the signal lines 221 and 222, and the dummy part may include a plurality of dummy patterns that are unrelated to an electrical connection.

Since configurations and functions of the conductor pattern and the dummy pattern included in the ground parts 230 and 250 as the impedance adjusting part and the dummy part as described above are the same as those of the conductor pattern and the dummy pattern shown in FIGS. 2A to 11, a detailed description therefor will be omitted in order to avoid an overlapped description.

As described above, in the printed circuit board 200 according to the present exemplary embodiment, similar to a first exemplary embodiment, the ground patterns included in the ground parts 230 and 250 may have the shapes shown in FIGS. 2A to 9.

Therefore, in the printed circuit board 200 according to the present exemplary embodiment, lengths of signal feedback paths in the ground parts 230 and 250 may be adjusted using the shapes of the ground patterns as described above, such that an impedance may be adjusted, which will be described later.

In addition, in the printed circuit board 200 according to the present exemplary embodiment, similar to a first exemplary embodiment, the dummy patterns are implemented together with the ground patterns in ground regions, thereby making it possible to increase a ratio of conductors in the ground regions. Therefore, in the printed circuit board 200 according to the present exemplary embodiment, similar to a first exemplary embodiment, the impedance may be adjusted, and warpage preventing characteristics may be improved.

In addition, in the printed circuit board 200 according to the present exemplary embodiment, similar to a first exemplary embodiment, the conductor patterns and the dummy patterns having the shapes shown in FIGS. 2A to 9 may be included in the ground parts 230 and 250 in the configuration as shown in FIG. 10B or FIG. 11, such that non-uniformity of the ratios of the conductors between the signal transmitting part 220 and the ground parts 230 and 250 may be improved, and non-uniformity of the ratios of the conductors in each region of the ground parts 230 and 250 may be improved.

Therefore, in the printed circuit board 200 according to the present exemplary embodiment, generation of warpage in the printed circuit board 200 due to the non-uniformity as described above may be decreased, such that warpage preventing characteristics may also be significantly improved, which will be described later.

Printed Circuit Board for Camera Module

Figure 13:
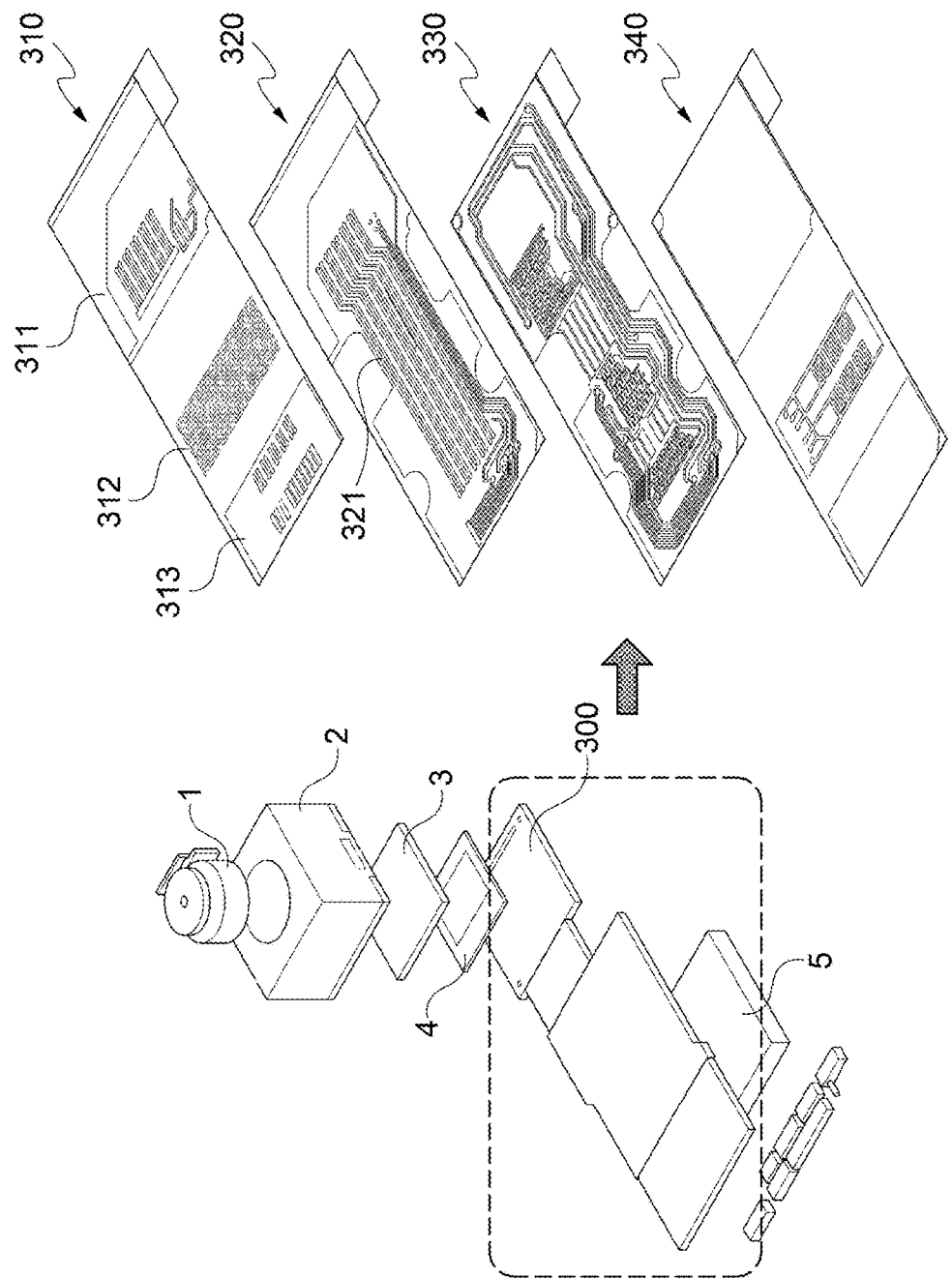
FIG. 13 is an exploded perspective view of a printed circuit board for a camera module according to the present exemplary embodiment.

FIG. 13 is an exploded perspective view of a printed circuit board 300 for a camera module according to the present exemplary embodiment.

The printed circuit board 300 for the camera module according to the present exemplary embodiment may be positioned below a lens assembly 1, a voice coil motor (VCM) assembly 2, an infrared (IR) filter 3, and an imaging sensor 4, and may also be positioned above an image signal process (ISP) module 5, as shown in FIG. 13.

The printed circuit board 300 according the present exemplary embodiment may include a signal transmitting part 320 and a ground part 330.

The signal transmitting part 320, which is to provide control signals to the VCM assembly 2, the imaging sensor 4, the ISP module 5, and the like, may include at least one signal line 321.

The signal line 321 according to the present exemplary embodiment, which is to support the MIPI, may be configured of four pairs of lanes and one clock line. However, the present disclosure is not limited thereto. The signal line 321 may be configured of only one signal line.

Figure 14:
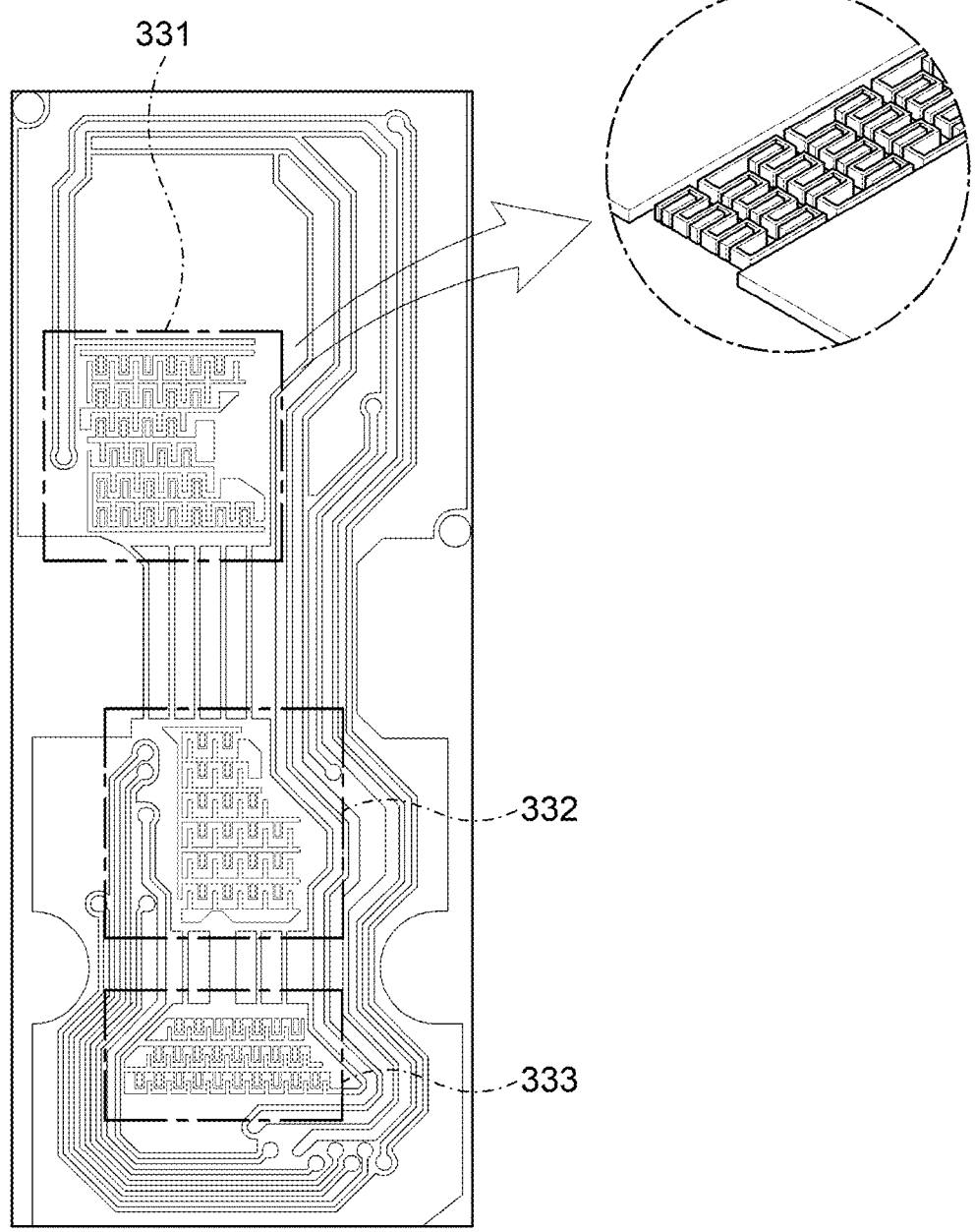
FIG. 14 is a detailed configuration diagram for a ground part of FIG. 13.

In addition, the ground part 330, which is to provide a ground to the signal line 321 of the signal transmitting part 320, may include first to third patterns 331 to 333 (shown in FIG. 14).

Here, the first to third patterns 331 to 333 may include a conductor pattern having a path longer than that of the signal line 321 as a first impedance adjusting unit, and include a plurality of dummy patterns that are unrelated to an electrical connection as a first dummy part.

FIG. 14 is a detailed configuration diagram for the ground part 330 of FIG. 13, and shows particularly the first to third patterns 331 to 333 in more detail.

The first pattern 331 of the ground part 330 may be formed on a portion in which the signal line 321 contacts the VCM assembly 2, as shown in FIGS. 13 and 14.

In addition, the second pattern 332 of the ground part 330 may be formed below a middle point of the signal line 321, as shown in FIGS. 13 and 14.

In addition, the third pattern 333 of the ground part 330 may be formed on a portion in which the signal line 321 is connected to a control signal line 313 of a sensor mounting part 310 to be described below, as shown in FIGS. 13 and 14.

Since the first to third patterns 331 to 333 included as the first impedance adjusting part and the first dummy part in the ground part 330 may have the same configuration and function as those of the patterns shown in FIGS. 2A to 11, a detailed description therefor will be omitted.

In addition, the printed circuit board 300 for a camera module according to the present exemplary embodiment may further include a sensor mounting part 310 for mounting the sensor 4, as shown in FIG. 13.

The sensor mounting part 310 may include a sensor mounting portion 311, a fourth pattern 312, and the control signal line 313, as shown in FIG. 13.

Here, the fourth pattern 312 may include a conductor pattern having a path longer than that of the signal line 321 to configure a second impedance adjusting part and include a plurality of dummy patterns that are unrelated to an electrical connection to configure a second dummy part, similar to the first to third patterns 331 to 333 of the ground part 330.

In addition, the fourth pattern 312 may be positioned above a portion through which the signal line 321 passes to enable impedance matching.

Meanwhile, since the fourth pattern 312 included as the second impedance adjusting part and the second dummy part as described above in the sensor mounting part 310 may have the same configuration and function as those of the patterns shown in FIGS. 2A to 11, a detailed description therefor will be omitted.

In addition, the printed circuit board 300 for a camera module according to the present exemplary embodiment may further include a connector part 340, as shown in FIG. 13.

The connector part 340, which is to provide a connection with the outside, may be rigidly formed.

The printed circuit board 300 for a camera module according to the present exemplary embodiment may be configured as described above to enable the impedance matching through the sensor mounting part 310, the signal transmitting part 320, the ground part 330, and the like.

Particularly, the ground patterns included in the sensor mounting part 310 and the ground part 330 may have the shapes shown in FIGS. 2A to 9.

Therefore, the printed circuit board 300 for a camera module according to the present exemplary embodiment may adjust lengths of signal feedback paths in the sensor mounting part 310 and the ground part 330 using the shapes of the ground patterns as described above, such that an impedance may be adjusted, which will be described later.

In addition, in the printed circuit board 300 for a camera module according to the present exemplary embodiment, the dummy patterns are implemented together with the ground patterns in a ground region and a sensor mounting region, thereby making it possible to increase a ratio of conductors in the ground region, or the like. Therefore, in the printed circuit board 300 for a camera module according to the present exemplary embodiment, the impedance may be adjusted, and warpage preventing characteristics may be improved.

Further, in the printed circuit board 300 for a camera module according to the present exemplary embodiment, since the ground patterns and the dummy patterns having the shapes shown in FIGS. 2A to 9 may be included in the sensor mounting part 310 and the ground part 330 in the configuration as shown in FIG. 10B or 11, non-uniformity of the ratios of the conductors between the signal transmitting part 320 and the ground part 330 or between the signal transmitting part 320 and the sensor mounting part 310 may be improved, and non-uniformity of the ratios of the conductors for each region in the sensor mounting part 310 and the ground part 330 may be improved.

Therefore, in the printed circuit board 300 for a camera module according to the present exemplary embodiment, generation of warpage in the printed circuit board due to the non-uniformity as described above may be significantly decreased, such that warpage preventing characteristics may be more significantly improved, which will be described later.

Characteristics for Printed Circuit Board According to Present Exemplary Embodiment (Including Printed Circuit Board for Camera Module)

<Impedance Characteristics>

Figure 15:
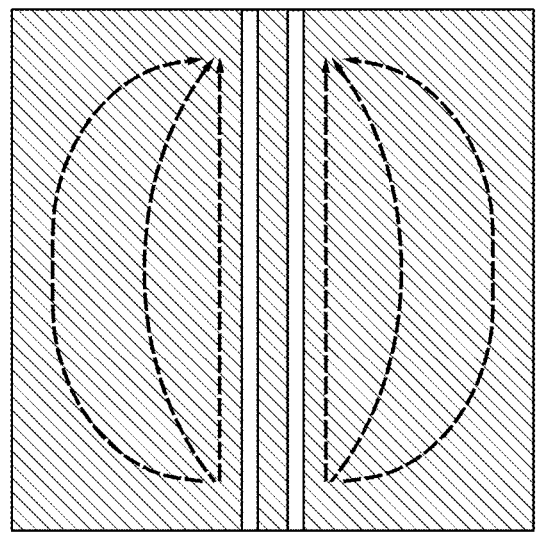
FIG. 15 is a view showing a signal feedback path in a ground part having a general structure.

FIG. 15 is a view showing a signal feedback path in a ground part having a general structure.

Figure 16A:
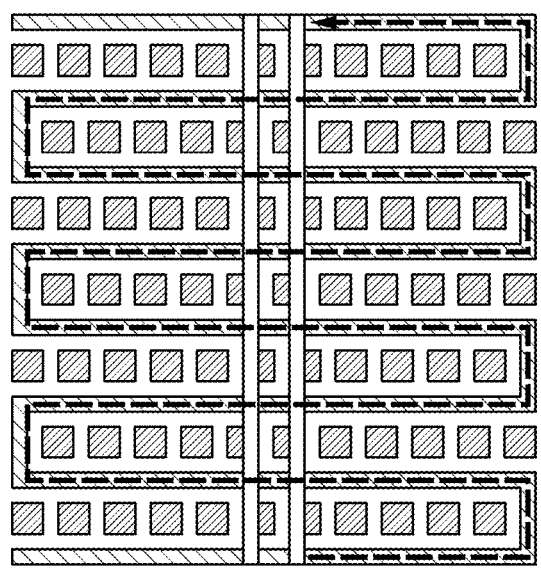
FIG. 16A is a view showing a signal feedback path in the ground part including the conductor pattern and the dummy pattern of FIGS. 2A and 2B.
Figure 16B:
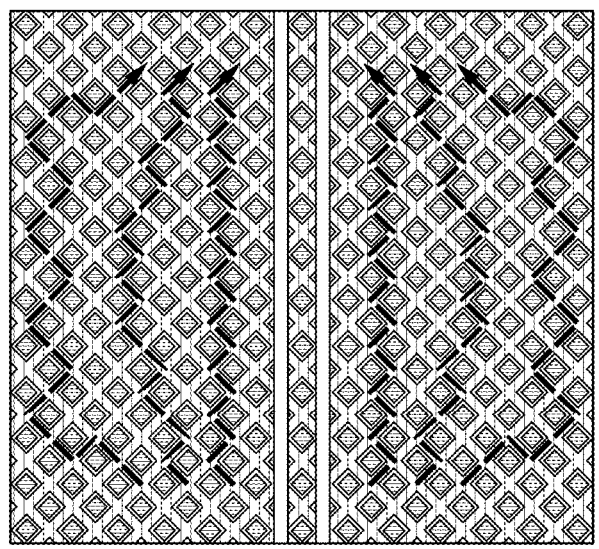
FIG. 16B is a view showing a signal feedback path in the ground part including the conductor pattern and the dummy pattern of FIG. 9.

In addition, FIGS. 16A and 16B are views showing a signal feedback path in the ground part according to the present exemplary embodiment. More particularly, FIG. 16A is a view showing a signal feedback path in the ground part including the conductor pattern and the dummy pattern of FIGS. 2A and 2B; and FIG. 16B is a view showing a signal feedback path in the ground part including the conductor pattern and the dummy pattern of FIG. 9.

Referring to FIGS. 15, 16A, and 16B, it may be clearly confirmed that in the case in which the conductor pattern included in the ground part has the shape according to the present exemplary embodiment, a length of the signal feedback path in the ground part may be adjusted.

That is, unlike the ground part having the general structure (a fill structure in which a ratio of the conductor patterns is 100%) as shown in FIG. 15, in the case in which the conductor pattern having the shape according to the present exemplary embodiment is included in the ground part, the length of the signal feedback path may be variously adjusted depending the shape of the conductor pattern included in the ground part, as shown in FIGS. 16A and 16B.

Therefore, according to the present exemplary embodiment, as clearly confirmed from contents shown in FIGS. 15, 16A and 16b, the length of the signal feedback path in the ground part may be adjusted depending on the shape of the conductor pattern (ground pattern) included in the ground part, thereby making it possible to adjust the impedance.

Meanwhile, since impedance characteristics are affected by the height (that is, h in the first exemplary embodiment and h1 and h2 in the second exemplary embodiment) between the signal line and the ground pattern, when the height becomes low, the impedance characteristics cannot but be decreased, which may act as a very large obstacle in the impedance matching.

However, according to the present exemplary embodiment, even though the height gradually becomes low due to a recent technical trend toward miniaturization, thinness, or the like, the conductor pattern having the shape according to the present exemplary embodiment is included in the ground part, such that the decreased impedance characteristics may be increased, which may also be clearly confirmed from the FIGS. 17A, 17B, and 18 to be described below.

Figure 17A:
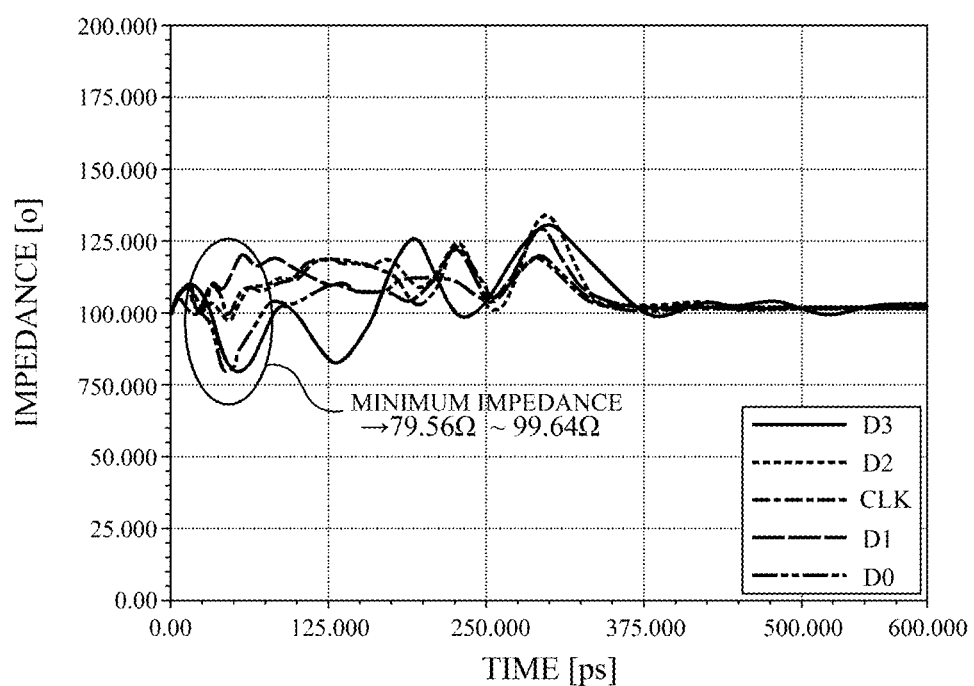
FIG. 17A is a view showing a simulation result for impedance characteristics of a printed circuit board having a general structure over time.
Figure 17B:
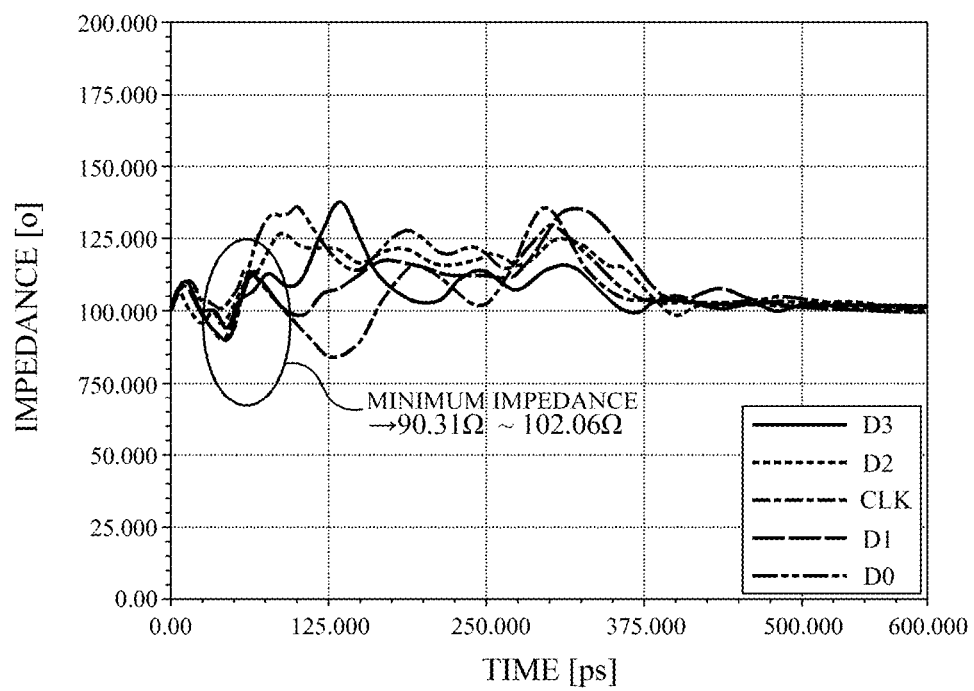
FIG. 17B is a view showing a simulation result for impedance characteristics of a printed circuit board according to the present exemplary embodiment over time.

FIGS. 17A and 17B are views showing simulation results for impedance characteristics (FIG. 17A) of a printed circuit board having a general structure and impedance characteristics (FIG. 17B) of a printed circuit board according to the present exemplary embodiment, over time.

Figure 18:
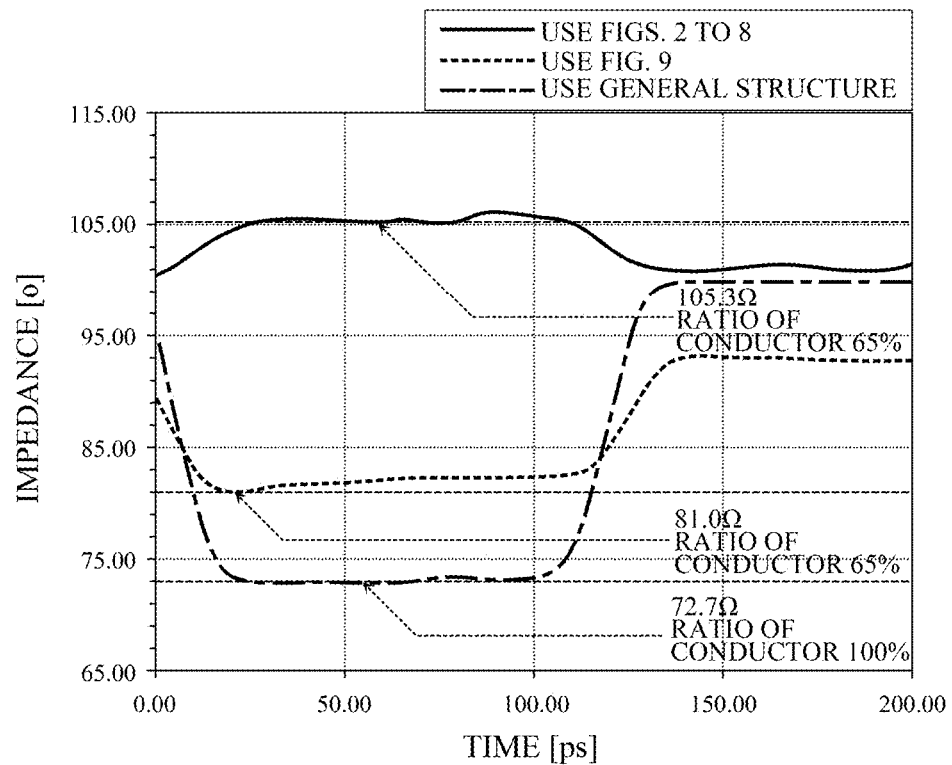
FIG. 18 is a view showing simulation results for impedance characteristics of a printed circuit board in which a ground part having a general structure is used, impedance characteristics of a printed circuit board in which the conductor pattern and the dummy pattern shown in FIGS. 2A to 8 are included in the ground part, and impedance characteristics of a printed circuit board in which the conductor pattern and the dummy pattern shown in FIG. 9 are included in the ground part, over time.

In addition, FIG. 18 is a view showing a simulation result for impedance characteristics of a printed circuit board in which a ground part having a general structure is used, impedance characteristics of a printed circuit board in which the conductor pattern and the dummy pattern shown in FIGS. 2A to 8 are included in the ground part, and impedance characteristics of a printed circuit board in which the conductor pattern and the dummy pattern shown in FIG. 9 are included in the ground part, over time.

Referring to FIGS. 17A, 17B, and 18, it may be clearly confirmed that in the case in which the conductor pattern formed in the ground part has the shape according to the present exemplary embodiment, the impedance characteristics may be increased.

That is, according to the simulation results of FIGS. 17A and 17B, it may be confirmed that minimum impedances of FIG. 17B are much more increased than those of FIG. 17A in impedance characteristics of various signal lines D0 to D4 and CLK in the printed circuit board, over time.

In addition, according to the simulation result of FIG. 18, it may be confirmed that in the case in which the conductor pattern having the shape according to the present exemplary embodiment is included in the ground part, an impedance increased by about 12% to 45% as compared with the printed circuit board using the ground part having the general structure may be implemented.

As a result, according to the present exemplary embodiment, as clearly confirmed from the simulation results of FIGS. 17A, 17B, and 18, the impedance characteristics which cannot but be decreased in accordance with a recent technical trend may be increased, such that the impedance matching may be easily performed. Therefore, problems (damage to the IC, energy loss, and the like) occurring when the impedance matching is not properly performed may be easily solved.

Meanwhile, referring to FIG. 18, it may be confirmed that in the case in which the ratios of the conductors in the ground parts including the conductor patterns (that is, the conductor patterns including the plurality of unit patterns having the open curve shape) shown in FIGS. 2A to 8 and the ratio of the conductors in the ground part including the conductor pattern (that is, the conductor pattern including the plurality of unit patterns having the closed curve shape) shown in FIG. 9 are the same as each other, the impedances formed by the conductor patterns shown in FIGS. 2A to 8 are larger than the impedance formed by the conductor pattern shown in FIG. 9.

That is, according to the simulation result of FIG. 18, it may be confirmed that when the ratios of the conductors in the ground parts including the conductor patterns shown in FIGS. 2A to 8 and the ratio of the conductors in the ground part including the conductor pattern shown in FIG. 9 are the same as each other (65% in the present exemplary embodiment), larger impedance characteristics may be implemented in the case in which the conductor patterns shown in FIGS. 2A to 8 are included in the ground parts than in the case in which the conductor pattern shown in FIG. 9 is included in the ground part.

Therefore, when the ratios of the conductors in the ground parts are same as each other, it is more advantageous in the impedance characteristics to allow the conductor patterns (the conductor patterns shown in FIGS. 2A to 8) including the plurality of unit patterns having the open curve shape to be included in the ground parts than to allow the conductor pattern (the conductor pattern illustrated in FIG. 9) including the plurality of unit patterns having the closed curve shape to be included in the ground part.

<Warpage Preventing Characteristics>

Figure 19:
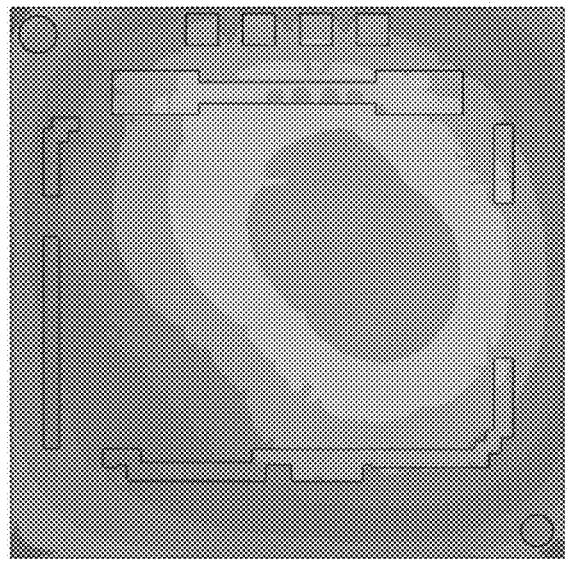
FIG. 19 is a view showing a simulation result for warpage preventing characteristics of a printed circuit board having a general structure.
Figure 20:
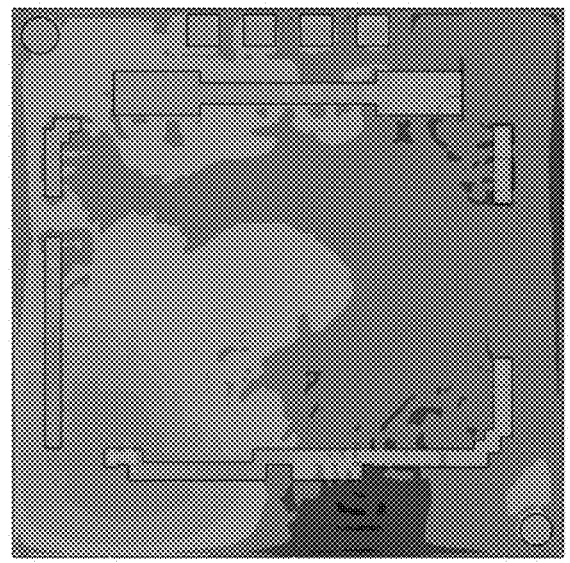
FIG. 20 is a view showing a simulation result for warpage preventing characteristics of a printed circuit board in which the ground part of FIG. 10B is used.
Figure 21:
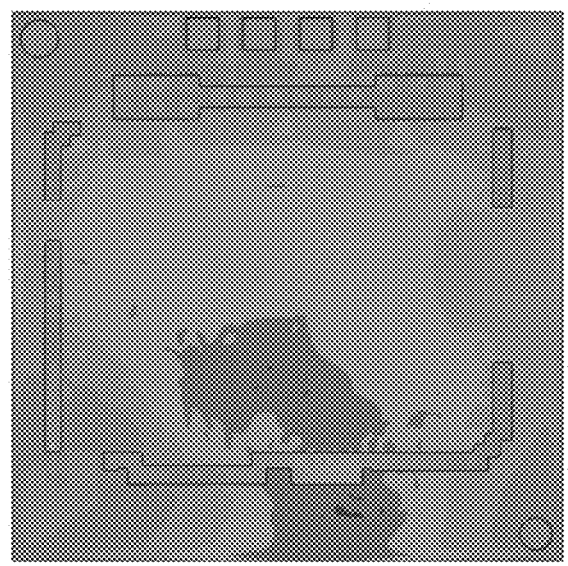
FIG. 21 is a view showing a simulation result for warpage preventing characteristics of a printed circuit board in which the ground part of FIG. 11 is used.

FIG. 19 is a view showing a simulation result for warpage preventing characteristics of a printed circuit board having a general structure. In addition, FIGS. 20 and 21 are views showing simulation results for warpage preventing characteristics of printed circuit boards according to the present exemplary embodiment. In more detail, FIG. 20 shows warpage preventing characteristics of a printed circuit board in which the ground part of FIG. 10B is used; and FIG. 21 shows warpage preventing characteristics of a printed circuit board in which the ground part of FIG. 11 is used.

In the simulation results of FIGS. 19 to 21, a red color, a yellow color, a blue color, a green color, and the like, appear. Here, the more the red, the easier the occurrence of the warpage, and the more the green, the more difficult the occurrence of the warpage. Therefore, in the case in which red color and yellow color regions appear in the simulation result, it represents that portions at which warpage preventing characteristics are bad are generated.

First, referring to FIG. 19, it may be confirmed that in the case of the printed circuit board having the general structure, the red color and yellow color regions occupy a relatively wide region across a center portion and a right upper end. Therefore, it may be confirmed that warpage having a high value has occurred.

On the contrary, it may be confirmed that in the case of the printed circuit board of FIG. 20, the non-uniformity of the ratios of the conductors between the signal transmitting part and the ground part may be improved as described above, such that the warpage preventing characteristics may be improved as compared with the printed circuit board of FIG. 19, as shown in FIG. 20.

That is, according to the simulation result of FIG. 20, it may be confirmed that only blue color and green color regions appear, the red color and yellow regions do not appear, and warpage having a value significantly lower than that of the printed circuit board of FIG. 19 has occurred, and the like. Therefore, it may be clearly confirmed that the warpage preventing characteristics may be significantly improved in the printed circuit board of FIG. 20 as compared with the printed circuit board of FIG. 19.

Meanwhile, referring to FIG. 21, it may be appreciated that the non-uniformity of the ratios of the conductors for each region in the ground part as well as the non-uniformity of the ratios of the conductors between the signal transmitting part and the ground part may be improved, as described above, such that the warpage preventing characteristics may be improved as compared with the printed circuit board of FIG. 19 and may also be improved as compared with the printed circuit board of FIG. 20, as shown in FIG. 21.

That is, according to the simulation result of FIG. 21, it may be confirmed that only blue color and green color regions appear, red color and yellow color regions do not appear, warpage having a value significantly lower than that of the printed circuit board of FIG. 19 has occurred, the green region becomes much wider than that of the printed circuit board of FIG. 20, warpage having a value lower than that of the printed circuit board of FIG. 20 has occurred, and the like. Therefore, it may be confirmed that the warpage preventing characteristics may be significantly improved in the printed circuit board of FIG. 21 as compared with the printed circuit board of FIG. 19 and may also be improved in the printed circuit board of FIG. 21 as compared with the printed circuit board of FIG. 20.

As set forth above, according to exemplary embodiments of the present disclosure, the impedance may be adjusted, and the warpage preventing characteristics may be significantly improved.

In the present specification, 'an exemplary embodiment' and other modified expressions of principles of the present disclosure mean that specific features, structures, characteristics, or the like, are included in at least one exemplary embodiment of the principles of the present disclosure. Therefore, all of the expression "an exemplary embodiment" and other modified examples mentioned throughout the present specification do not necessarily indicate the same exemplary embodiment.

In the present specification, the expression "at least one of A and B" is used to include a selection of only A, only B, or both A and B. Furthermore, the expression "at least one of A through C" may be used to include a section of only A, only B, only C, only A and B, only B and C, or all of A to C. Those skilled in the art would be able to clearly interpret a similar expression with more elements.

Hereinabove, the present disclosure has been described with reference to exemplary embodiments thereof. All exemplary embodiment and conditional illustrations in the present specification have been described to intend to assist in understanding of a principle and concept of the present disclosure by those skilled in the art. Therefore, it will be understood by those skilled in the art that various changes in form and details may be made therein without departing from the spirit and scope of the inventive concept as defined by the appended claims. Therefore, the exemplary embodiments disclosed herein should be considered in an illustrative aspect rather than a restrictive aspect. The scope of the present disclosure should be defined by the following claims rather than the above-mentioned description, and all technical spirits equivalent to the following claims should be interpreted as being included in the present disclosure.

What is claimed is:

1. A printed circuit board comprising:
   a signal transmitting part;
   a ground part comprising an impedance adjusting part and a dummy part, wherein the impedance adjusting part comprises conductor patterns and the dummy part comprises a plurality of dummy patterns; and
   an insulating layer disposed between the signal transmitting part and the ground part,
   wherein the conductor patterns and the dummy patterns are formed so that each corresponding region comprising the signal transmitting part and the ground part comprises a ratio of conductors and a deviation between ratios of conductors in each corresponding region is minimized, wherein the ratio of conductors is the area of conductors of the signal transmitting part in the corresponding region to the area of the corresponding region plus the area of the conductors of the ground part in the corresponding region to the area of the corresponding region.

2. The printed circuit board according to claim 1, wherein the signal transmitting part includes at least one signal line, and
   the impedance adjusting part includes conductor patterns having a path longer than that of the signal line.

3. The printed circuit board according to claim 2, wherein the conductor pattern includes a plurality of unit patterns having an open curve shape.

4. The printed circuit board according to claim 3, wherein the unit patterns enclose at least one dummy pattern.

5. The printed circuit board according to claim 4, wherein the conductor patterns and the dummy patterns are formed so that a deviation between ratios of conductors in each region of the ground part is minimized.

6. The printed circuit board according to claim 4, wherein the open curve has a U shape.

7. The printed circuit board according to claim 6, wherein the conductor patterns and the dummy patterns are formed so that a deviation between ratios of conductors in each region of the ground part is minimized.

8. The printed circuit board according to claim 4, wherein the unit patterns having the open curve shape include at least one sub unit pattern.

9. The printed circuit board according to claim 8, wherein the sub unit patterns have an open curve shape.

10. The printed circuit board according to claim 9, wherein the sub unit patterns enclose at least one dummy pattern.

11. The printed circuit board according to claim 10, wherein the conductor patterns and the dummy patterns are formed so that a deviation between ratios of conductors in each region of the ground part is minimized.

12. The printed circuit board according to claim 8, wherein the sub unit patterns have a closed curve shape.

13. The printed circuit board according to claim 12, wherein the sub unit patterns enclose at least one dummy pattern.

14. The printed circuit board according to claim 13, wherein the conductor patterns and the dummy patterns are formed so that a deviation between ratios of conductors in each region of the ground part is minimized.

15. The printed circuit board according to claim 3, wherein at least one unit pattern having a closed curve shape is disposed between the unit patterns having the open curve shape.

16. The printed circuit board according to claim 15, wherein the unit patterns having the open curve shape and the unit pattern having the closed curve shape enclose at least one dummy pattern.

17. The printed circuit board according to claim 16, wherein the conductor patterns and the dummy patterns are formed so that a deviation between ratios of conductors in each region of the ground part is minimized.

18. The printed circuit board according to claim 3, wherein in the conductor pattern, the plurality of unit patterns are connected to each other to form one path.

19. The printed circuit board according to claim 2, wherein the conductor pattern includes a plurality of unit patterns having a closed curve shape.

20. The printed circuit board according to claim 19, wherein the unit patterns enclose at least one dummy pattern.

21. The printed circuit board according to claim 20, wherein the conductor patterns and the dummy patterns are formed so that a deviation between ratios of conductors in each region of the ground part is minimized.

22. The printed circuit board according to claim 18, wherein when a ratio of conductors in the ground part including the conductor pattern including the plurality of unit patterns having the open curve shape and a ratio of conductors in the ground part including the conductor pattern including the plurality of unit patterns having the closed curve shape are the same as each other, an impedance formed by the conductor pattern including the plurality of unit patterns having the open curve shape is larger than an impedance formed by the conductor pattern including the plurality of unit patterns having the closed curve shape.

23. A printed circuit board for a camera module, comprising:
a signal transmitting part configured to transmit a control signal;
a ground part providing a ground to the signal transmitting part, the ground part comprising a first impedance adjusting part and a first dummy part, wherein the impedance adjusting part comprises conductor patterns and the first dummy part comprises a plurality of dummy patterns; and
an insulating layer disposed between the signal transmitting part and the ground part,
wherein the conductor patterns and the dummy patterns are formed so that each corresponding region comprising the signal transmitting part and the ground part comprises a ratio of conductors and a deviation between ratios of conductors in each corresponding region is minimized, and wherein the ratio of conductors is the area of conductors of the signal transmitting part in the corresponding region to the area of the corresponding region plus the area of the conductors of the ground part in the corresponding region to the area of the corresponding region.

24. The printed circuit board for a camera module according to claim 23, wherein the signal transmitting part includes at least one signal line, and
the first impedance adjusting part includes conductor patterns having a path longer than that of the signal line.

25. The printed circuit board for a camera module according to claim 24, wherein the conductor pattern includes a plurality of unit patterns having an open curve shape.

26. The printed circuit board for a camera module according to claim 25, wherein the unit patterns enclose at least one dummy pattern.

27. The printed circuit board for a camera module according to claim 26, wherein the conductor patterns and the dummy patterns are formed so that a deviation between ratios of conductors in each region of the ground part is minimized.

28. The printed circuit board for a camera module of claim 25, wherein in the conductor pattern, the plurality of unit patterns are connected to each other to form one path.

29. The printed circuit board for a camera module according claim 24, wherein the conductor pattern includes a plurality of unit patterns having a closed curve shape.

30. The printed circuit board for a camera module according claim 29, wherein the unit patterns enclose at least one dummy pattern.

31. The printed circuit board for a camera module according to claim 30, wherein the conductor patterns and the dummy patterns are formed so that a deviation between ratios of conductors in each region of the ground part is minimized.

32. The printed circuit board for a camera module according to claim 28, wherein when a ratio of conductors in the ground part including the conductor pattern including the plurality of unit patterns having the open curve shape and a ratio of conductors in the ground part including the conductor pattern including the plurality of unit patterns having the closed curve shape are the same as each other, an impedance formed by the conductor pattern including the plurality of unit patterns having the open curve shape is larger than an impedance formed by the conductor pattern including the plurality of unit patterns having the closed curve shape.

33. The printed circuit board for a camera module according to claim 24, further comprising a sensor mounting part for mounting a sensor to which the control signal is provided, wherein the sensor mounting part includes a second impedance adjusting part and a second dummy part.

34. The printed circuit board for a camera module according to claim 33, wherein the second impedance adjusting part includes conductor patterns having a path longer than that of the signal line, and the second dummy part includes a plurality of dummy patterns.

35. The printed circuit board for a camera module according to claim 34, wherein the conductor pattern of the second impedance adjusting part includes a plurality of unit patterns having an open curve shape.

36. The printed circuit board for a camera module according to claim 35, wherein the unit patterns enclose at least one dummy pattern.

37. The printed circuit board for a camera module according to claim 34, wherein the conductor pattern of the second impedance adjusting part includes a plurality of unit patterns having a closed curve shape.

38. The printed circuit board for a camera module according to claim 37, wherein the unit patterns enclose at least one dummy pattern.

* * * * *